United States Patent
Nakamura et al.

(10) Patent No.: US 8,368,472 B2
(45) Date of Patent: Feb. 5, 2013

(54) OSCILLATION CIRCUIT

(75) Inventors: Takashi Nakamura, Kanagawa (JP); Kosuke Yayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 58 days.

(21) Appl. No.: 13/011,948

(22) Filed: Jan. 24, 2011

(65) Prior Publication Data

US 2012/0074986 A1    Mar. 29, 2012

(30) Foreign Application Priority Data

Sep. 24, 2010   (JP) ................... 2010-213441

(51) Int. Cl.
*H03L 7/02* (2006.01)
(52) U.S. Cl. .............. 331/34; 331/1 R; 327/105; 327/39
(58) Field of Classification Search .................. 331/1 R, 331/17, 34, 36 C, 177 R, 177 V; 327/39, 327/47, 141, 155, 105
See application file for complete search history.

(56) References Cited

U.S. PATENT DOCUMENTS

| 7,332,944 B2 * | 2/2008 | Fujita et al. ................... 327/113 |
| 2008/0068091 A1 * | 3/2008 | Kwan et al. ..................... 331/16 |
| 2008/0136536 A1 * | 6/2008 | Anand ............................ 331/17 |

FOREIGN PATENT DOCUMENTS

JP    2002-300027 A    10/2002

* cited by examiner

*Primary Examiner* — Ryan Johnson
(74) *Attorney, Agent, or Firm* — Mattingly & Malur, PC

(57) ABSTRACT

A high-accuracy clock signal is generated even when the settings of the clock frequency are changed or there is a variation in power supply, temperature, or the like. A frequency-voltage conversion circuit includes a switch portion including switches, electrostatic capacitive elements, and other switches. The electrostatic capacitive elements have different absolute capacitance values, and are provided so as to cover a frequency range intended by a designer. For example, based on 4-bit frequency adjustment control signals, the other switches select the electrostatic capacitive elements having the electrostatic capacitance values thereof each weighted with 2 to perform the switching of a frequency.

14 Claims, 32 Drawing Sheets

DUE TO ON RESISTANCES OF SELECTION SWITCHES, NON-LINEAR COMPONENTS OCCUR IN WAVEFORM VSIG TO CAUSE TEMPERATURE/ POWER DEPENDENCE

US 8,368,472 B2

OSCILLATION CIRCUIT

CROSS-REFERENCE TO RELATED APPLICATIONS

The disclosure of Japanese Patent Application No. 2010-213441 filed on Sep. 24, 2010 including the specification, drawings and abstract is incorporated herein by reference in its entirety.

BACKGROUND OF THE INVENTION

The present invention relates to a technology which is effective for a semiconductor device having a clock oscillation circuit which generates a clock signal used for a circuit operation.

In a semiconductor device such as a microcomputer, a reduction in external components is required for a device size reduction, a cost reduction, and the like. Examples of the semiconductor device include one in which a clock oscillation circuit for generating a clock signal to be supplied to internal modules such as a CPU (Central Processing Unit) and a peripheral functional block is embedded.

In general, the semiconductor device further has a frequency divider for dividing the frequency of the clock signal generated by the clock oscillation circuit. The frequency divider is provided so as to increase clock frequency options to be chosen by selecting a frequency division ratio.

The clock oscillation circuit has, for example, a reference voltage generation circuit, a current generation circuit, a control circuit, a frequency-voltage conversion circuit, and an oscillation circuit. The frequency-voltage conversion circuit, the oscillation circuit, and the control circuit form a feedback loop.

The reference voltage generation circuit generates each of reference voltages VREFI and VREFC, and outputs the generated reference voltages VREFI and VREFC to the current generation circuit and the oscillation circuit. As the current generation circuit, a constant current generation circuit is used which outputs a substantially constant current based on the reference voltages.

Here, a current Iref having small power-supply/temperature dependence is generated. The frequency-voltage conversion circuit generates a voltage VSIG based on the current Iref generated by the current generation circuit, a capacitance, and a control signal generated by the control circuit.

The control circuit generates the control signal based on the clock signal generated by a voltage controlled oscillation circuit. The frequency-voltage conversion circuit generates a voltage based on the current generated by the current generation circuit, the capacitance, and the control signal generated by the control circuit from the clock signal outputted from the voltage controlled oscillation circuit. The oscillation circuit has an integration circuit.

The integration circuit changes the control voltage of the voltage controlled oscillation circuit such that the reference voltage VREFC generated by the reference voltage generation circuit is equal to the voltage VSIG outputted from the frequency-voltage conversion circuit to adjust the clock frequency to a desired frequency.

As an example of this type of clock oscillation circuit, there is known a clock oscillation circuit in which a current controlled oscillator, a frequency divider, a frequency comparison circuit, an integrator, and a voltage-current conversion circuit are coupled in series. By feed-backing an output current of the voltage-current conversion circuit in the final stage to the input side of the current controlled oscillator in the first stage, and using an output of the current controlled oscillator as an oscillation output, the stabilization of an oscillation frequency and an improvement in oscillation accuracy are intended to be achieved (see Patent Document 1).

PRIOR ART DOCUMENT

Patent Document

[Patent Document 1]
Japanese Unexamined Patent Publication No. 2002-300027

SUMMARY OF THE INVENTION

However, the present inventors have found that a clock generation technique in a clock oscillation circuit provided within a semiconductor device as described above has the following problem.

FIG. 44 shows a basic configuration of an on-chip oscillator as a clock oscillator provided in a conventional semiconductor device.

The on-chip oscillator is formed of a clock oscillation circuit in which a reference voltage generation circuit, a current generation circuit, a control circuit, a frequency-voltage conversion circuit, an integration circuit, and a voltage controlled oscillation circuit form a feedback loop.

An oscillation frequency T of a clock signal generated by the clock oscillation circuit described above is represented by the following expression (1) including a capacitance C embedded in the frequency-voltage conversion circuit, a constant current component VREFI/R generated in the circuit, and the reference voltage VREFC.

The oscillation frequency T is held constant by controlling a ratio between the reference voltages VREFI and VREFC with respect to the capacitance C and the resistance R which are constants.

$$T = \frac{C \cdot VREFC}{\frac{VREFI}{R}} \tag{1}$$

An operation of the circuit of FIG. 44 will be described.
The reference voltage generation circuit generates the reference voltages VREFC and VREFI, and outputs the generated reference voltages VREFC and VREFI to the current generation circuit and the integration circuit. The current generation circuit internally generates the constant current Iref showing small temperature dependence in response to a power supply voltage change or a temperature change, converts the constant current Iref at a constant ratio using a current mirror circuit to generate a current Iconst, and outputs the generated current Iconst to the frequency-voltage conversion circuit. The frequency-voltage conversion circuit generates the voltage VSIG using the current Iconst outputted from the current generation circuit and control signals ZCHR, DISC, and SAMP generated by the control circuit from the clock from the voltage controlled oscillation circuit. Each of the control signals ZCHR, DISC, and SAMP has a pulse width equal to an output clock frequency. The integration circuit samples the voltage VSIG, changes a control voltage VCNT from the voltage controlled oscillation circuit such that the reference voltage VREFC having no power-supply/temperature dependence is equal to the output VSIG of the frequency-voltage conversion circuit, and adjusts the clock frequency to a desired frequency.

In the clock oscillation circuit, error factors resulting from the temperature characteristics of elements included in the circuit, variations in the circuit, and the like exist, as shown in an expression (2) which is shown in contrast to the expression (1).

$$T = \frac{C(t) \cdot (1 + Cp2/C(t)) \cdot (VREFC + \Delta Vof2) + Cp1 \cdot \Delta V_{NDD}}{M \cdot \left(\frac{(VREFI + \Delta Vof1)}{R(t)}\right) \pm \Delta I_{mismatch} + Ioff} \quad (2)$$

In the expression (2), C(t) represents an electrostatic capacitive element having temperature dependence in contrast to the ideal capacitance C in the expression (1) and R(t) represents a resistive element having temperature dependence in contrast to the ideal resistance R in the expression (1), while M is a constant of the ratio of the current conversion using the current mirror circuit for a frequency switching function, though not shown in the expression (1).

Examples of the error factors include the following: (i) the current error ΔImismatch resulting from the threshold voltage mismatch ΔVth between transistors included in the current mirror circuit or the like, which is added to or subtracted from the current component in the denominator of the expression (1) to become an error; (ii) the parasitic capacitance Cp1 at a terminal NDD reached by the current flowing from the current generation circuit to the frequency-voltage conversion circuit and the voltage variation ΔVNDD at the terminal NDD, which are added to the component of the product between the capacitance and the voltage in the numerator to become errors; (iii) the parasitic capacitance Cp1 coupled to the output signal from the frequency-voltage conversion circuit, which is added to the internal capacitance C(t) of the frequency-voltage conversion circuit to become an error; (ix) the sub-threshold leakage Ioff in the transistors included in the current mirror circuit, which is added to the current component in the denominator to become an error; and (v) the offset voltages Vof1 and Vof2 in the current generation circuit and the operational amplifier of the integration circuit, which are added to the respective voltage components VREFI and VREFC in the denominator and the numerator to become errors.

The current error ΔImismatch as the error factor (i) changes when the frequency is switched with the constant M to cause a variation in an expected frequency. The switching of the frequency is a function which is embedded when needed according to the specifications of the semiconductor device. However, by switching the frequency, frequency accuracy varies to possibly cause a problem such as the influence thereof on an application.

To thus provide the clock signal with high frequency accuracy, it is essential to take measures against the error factor in the expression (2), and implement constant accuracy irrespective of the frequency.

In the conventional semiconductor device, when the clock frequency (including an operation frequency generated based on the clock frequency) is to be changed, the constant M is changed. The constant M is changed by changing the transistor size of the current mirror circuit. However, when the transistor size is changed, the current error ΔImismatch changes due to fluctuations in transistor variations.

Thus, it has been found that, when the clock frequency is switched, the influence of the transistor variations is one of important factors, and varies the clock frequency.

An object of the present invention is to provide a technology which enables a high-accuracy clock signal to be generated even when the settings of the clock frequency are changed or there is a variation in power supply, temperature, or the like.

The above and other novel features of the present invention will become apparent from a statement in the present specification and the accompanying drawings.

The following is a brief description of the outline of a representative aspect of the invention disclosed in the present application.

The present invention is characterized by including a power supply terminal to which an external power supply voltage is supplied, a clock oscillation circuit which outputs a clock signal, and an internal circuit which operates in accordance with an operation frequency generated based on the foregoing clock signal, wherein the foregoing clock oscillation circuit has a current output circuit capable of adjusting dependence of an output current therefrom on the foregoing power supply voltage and a temperature, a frequency-voltage conversion circuit which has a plurality of electrostatic capacitive elements coupled in parallel to a capacitive node for receiving the foregoing output current, and changes the number of the electrostatic capacitive elements to be coupled to thereby change a frequency of the foregoing clock signal, and a clock setting portion which generates a clock setting signal for setting the frequency of the foregoing clock signal, and outputs the clock setting signal to the foregoing frequency-voltage conversion circuit.

The following is a brief description of effects achievable by the representative aspect of the invention disclosed in the present application.

(1) Since it is possible to vary the capacitance value of the frequency-voltage conversion circuit, and perform the switching of the frequency of the clock signal, a high-accuracy clock signal can be generated.

(2) The effect (1) described above allows the reliability of the semiconductor device to be improved.

DESCRIPTION OF THE PREFERRED EMBODIMENTS

Figure 1:
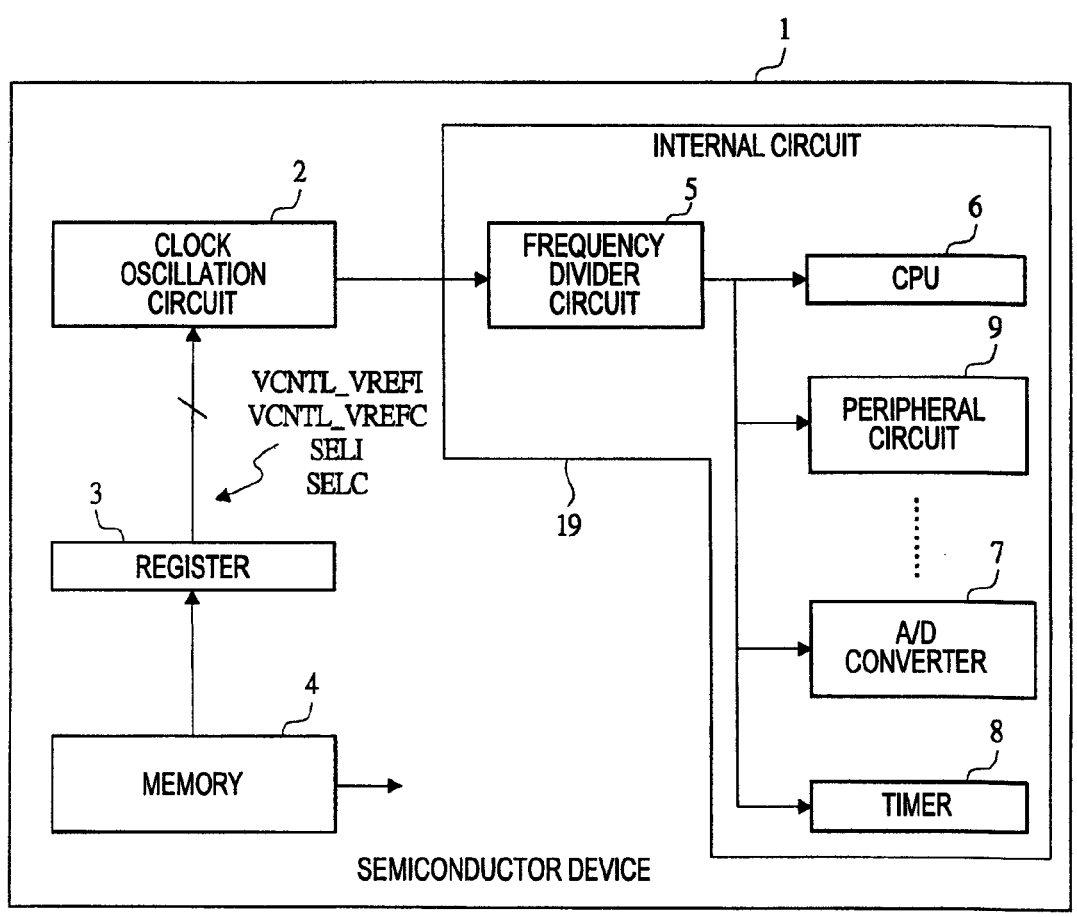
FIG. 1 is a block diagram showing an example of a structure of a semiconductor device according to Embodiment 1 of the present invention.

Hereinbelow, the embodiments of the present invention will be described in detail based on the drawings. Note that, throughout all the drawings for illustrating the embodiments, the same members are designated by the same reference numerals in principle, and a repeated description thereof is omitted.

<Outline of Invention>

A semiconductor device of the present invention includes a power supply terminal (power supply terminal 100) to which an external power supply voltage is supplied, a clock oscillation circuit (clock oscillation circuit 2) which outputs a clock signal, and an internal circuit (internal circuit 19) which operates in accordance with an operation frequency generated based on the foregoing clock signal. The foregoing clock oscillation circuit has a configuration including a current output circuit (current output circuit 11) capable to adjusting the dependence of an output current on the foregoing power supply voltage and a temperature, and a frequency-voltage conversion circuit (frequency-voltage conversion circuit 13) which has a plurality of electrostatic capacitive elements (first electrostatic capacitive element portion 113 and a second electrostatic capacitive element portion 114) capable of being coupled in parallel to a capacitive node (capacitive node 112) for receiving the foregoing output current, and changes the number of the capacitors to be coupled to thereby change a frequency of the foregoing clock signal.

A semiconductor device in a second form of the present invention includes a clock oscillation circuit (clock oscillation circuit 2), and an internal circuit (internal circuit 19) which operates in accordance with an operation frequency generated based on a clock signal outputted from the foregoing clock oscillation circuit. The foregoing clock oscillation circuit has a configuration including a constant current circuit (current output circuit 11) for supplying a constant output current, a capacitive node (capacitive node 112) for receiving the output current from the foregoing constant current circuit, a frequency-voltage conversion circuit having electrostatic capacitive elements capable of being coupled in parallel to the capacitive node, and a switch for switching the number of the electrostatic capacitive elements to be coupled to the foregoing capacitive node, and an oscillation circuit (oscillation circuit 18) for setting a frequency of the clock signal based on an output signal from the foregoing frequency-voltage conversion circuit, and outputting the foregoing clock signal.

Embodiment 1

Figure 45:
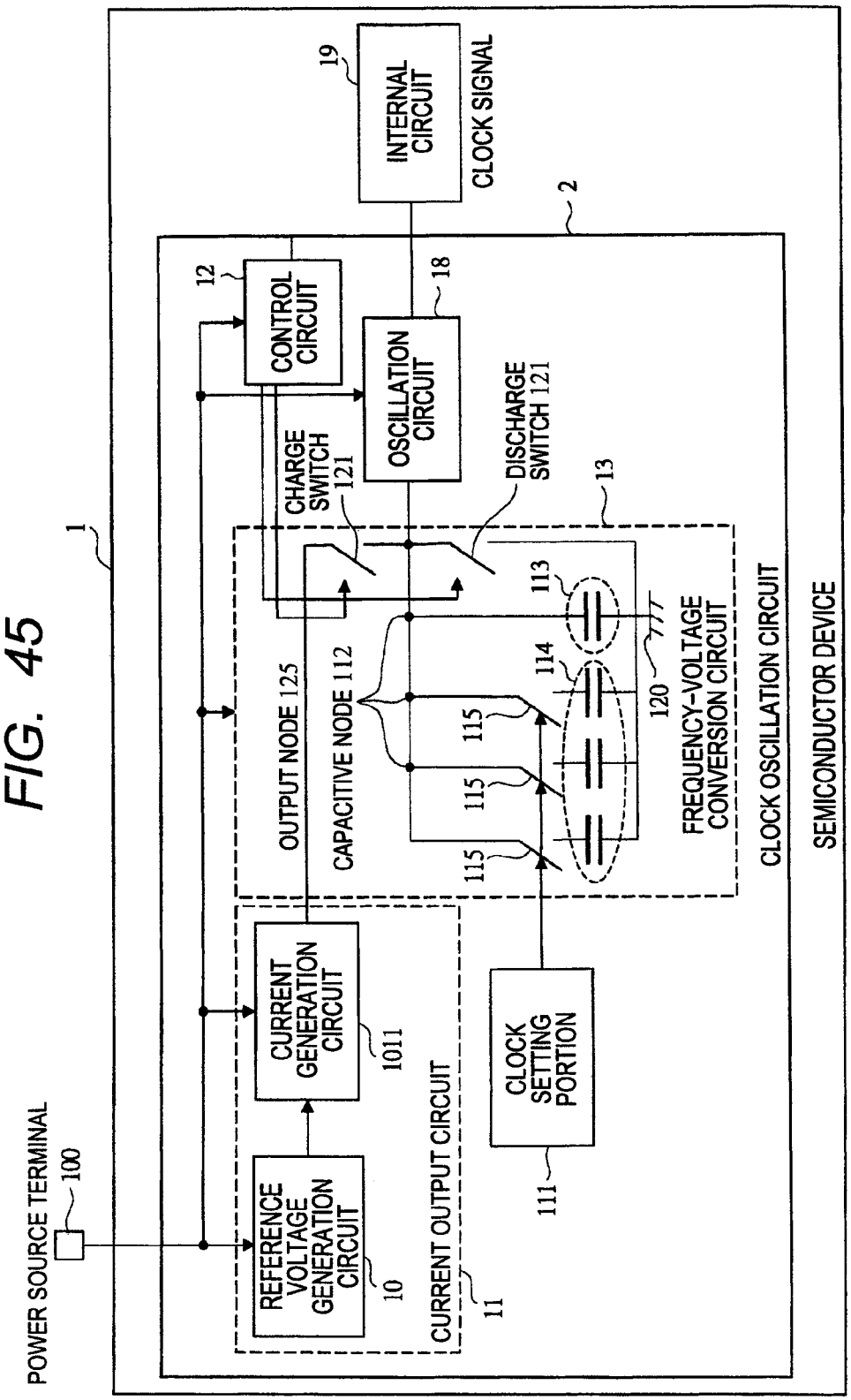
FIG. 45 is a block diagram illustrating a basic configuration of a clock oscillation circuit used as an on-chip oscillator according to the present invention.

FIG. 45 shows a structural view of the semiconductor device of Embodiment 1 of the present invention.

A semiconductor device 1 includes a power supply terminal 100, a clock oscillation circuit 2, and an internal circuit 19. To the power supply terminal 100, a power supply voltage is supplied from outside the semiconductor device. As the power supply voltage, a voltage in a range of, e.g., 1 V to 5 V is supplied. The clock oscillation circuit 2 is supplied with the power supply voltage from the power supply terminal 100, and outputs a clock signal. The internal circuit 19 operates by receiving the clock signal.

The clock oscillation circuit 2 has a current output circuit 11, a frequency-voltage conversion circuit 13, a clock setting portion 111, an oscillation circuit 18, and a control circuit 12. The current output circuit 11 outputs an output current having dependence on the power supply voltage and a temperature that can be adjusted.

As the current output circuit 11, there is used a constant current circuit which is generally immune to the influence of the dependence on the power supply voltage and the temperature, and outputs a constant current which is substantially constant even when the power supply voltage or the temperature changes or the like.

The output current of the current output circuit 11 is supplied to the frequency-voltage conversion circuit 13. The current output circuit 11 has a reference voltage generation circuit 10 and a current generation circuit 1011. The reference voltage generation circuit 10 is coupled to the power supply terminal 100, and generates a reference voltage from the power supply voltage with a voltage serving as a reference in the semiconductor device.

The current generation circuit 1011 receives the reference voltage, and outputs an output current. The frequency-voltage conversion circuit 13 is configured as follows, and a voltage is outputted from the capacitive node 112. The frequency-voltage conversion circuit 13 has a first electrostatic capacitive element portion 113, which is coupled to the capacitive node 112.

To the capacitive node 112, a second electrostatic capacitive element portion 114 is further coupled via capacitor selection switches 115. The first and second electrostatic capacitive element portions are coupled in parallel between a reference voltage node 120 to which the reference voltage is supplied and the capacitive node 112. As the reference voltage, 0V is normally supplied but, another voltage may also be supplied as the reference voltage as long as it is lower than the power supply voltage.

The clock oscillator circuit 2 also has a charge switch 121 coupled between an output node 125 from which the output current of the current output circuit 11 is outputted and the capacitive node 112, and a discharge switch 122 coupled between the capacitive node 112 and the reference voltage node 120.

When the charge switch 121 is turned ON, the output current flows to the capacitive node 112 to raise the voltage of the capacitive node 112. When the discharge switch 122 is turned ON, the voltage of the capacitive node 112 lowers.

In accordance with the frequency of the clock signal, ON/OFF timings for the charge switch 121 and the discharge switch 122 are controlled. Note that, in general, the respective ON timings for the charge switch 121 and the discharge switch 122 are set to cause complementary operations.

The speed at which the voltage of the capacitive node 112 changes varies depending on the frequency of the clock signal.

The oscillator circuit 18 receives the voltage of the capacitive node 112, and outputs the clock signal to the internal circuit 19. The oscillator circuit 18 changes the frequency of the clock signal in accordance with the voltage value of the capacitive node 112.

As the oscillator circuit, a ring oscillator or the like is typically used. The clock signal is sent also to the control circuit 12. The control circuit 12 controls the ON/OFF states of the charge switch 121 and the discharge switch 122 in accordance with the clock signal.

The frequency-voltage conversion circuit 13, the oscillator circuit 18, and the control circuit 12 form a feedback loop which generates the clock signal with a constant frequency. The internal circuit 19 includes circuits which receive the clock signal, and operate based on the clock signal, such as a CPU, an A/D (Analog/Digital) conversion circuit, and a frequency divider circuit for dividing the frequency of the clock signal.

The clock setting portion 111 generates a clock setting signal, and outputs the generated clock setting signal to the frequency-voltage conversion circuit 13. The capacitor selection switches 115 of the frequency-voltage conversion circuit 13 are controlled by the clock setting signal.

In this manner, the number of the electrostatic capacitive elements of the second electrostatic capacitive element portion 114 coupled to the capacitive node 112 is determined. As the number of the electrostatic capacitive elements coupled to the capacitive node 112 increases, the capacitance value of the capacitive node 112 increases, and the voltage change at the capacitive node 112 becomes slower.

That is, using the capacitance of the capacitive node 112, the voltage change at the capacitive node 112 can be adjusted. This allows the frequency of the clock signal to be changed. To adjust the voltage change at the capacitive node 112, a method can also be considered which adjusts an amount of the output current from the current output circuit 11.

As a method for adjusting the output current, it can be considered to adjust the sizes of transistors for supplying the current and the number of the transistors coupled in series.

However, the present inventors have noticed that, due to variations in the transistors for adjustment, it is difficult to generate a clock signal with high accuracy. The present inventors have also noticed that, particularly when the targeted frequency of the clock signal to be set is varied on a per semiconductor-device basis, it is difficult to control, e.g., variations relative to the high-accuracy targeted frequency to 5%, and further to 1% or less.

Depending on the application of equipment in which the semiconductor device 1 is mounted, the operation frequency of the internal circuit 19 may differ so that the clock frequency is also set to a different frequency. For example, the targeted frequency of the clock frequency is 10 MHz to 60 MHz.

As a result of examining the characteristics of elements, the present inventors have noticed that a frequency with higher accuracy relative to the targeted frequency can be generated by changing the number of the electrostatic capacitive elements to be coupled to the capacitive node 112 rather than by changing the targeted frequency using the transistors for supplying the current.

MOS transistors have manufacturing-derived characteristic variations. The characteristic variations result from a large number of factors such as, e.g., threshold voltage, gate length, and gate oxide film thickness. By contrast, the accuracy of the capacitance value of, e.g., a polysilicon-insulator-polysilicon capacitor or a metal-insulator-metal capacitor formed over a semiconductor element is substantially determined by the processing accuracy of element dimensions. In particular, the accuracy of the ratio between the respective capacitance values of the electrostatic capacitive elements formed in proximity over the same chip is high. Accordingly, compared with variations in the MOS transistors, variations in the electrostatic capacitive elements are relatively small.

As a result, instead of using a method which changes the sizes of transistors or the number of transistors coupled in parallel to thereby change the current value, by using a method which changes the values of the electrostatic capacitive elements and the number of the electrostatic capacitive elements coupled in parallel, the frequency of the clock signal can be adjusted with high accuracy.

Thus, by changing the number of the electrostatic capacitive elements coupled to the capacitive node 112, it is possible to generate the frequency with high accuracy relative to the targeted frequency.

Hereinbelow, a further description will be given of an internal configuration.

Figure 2:
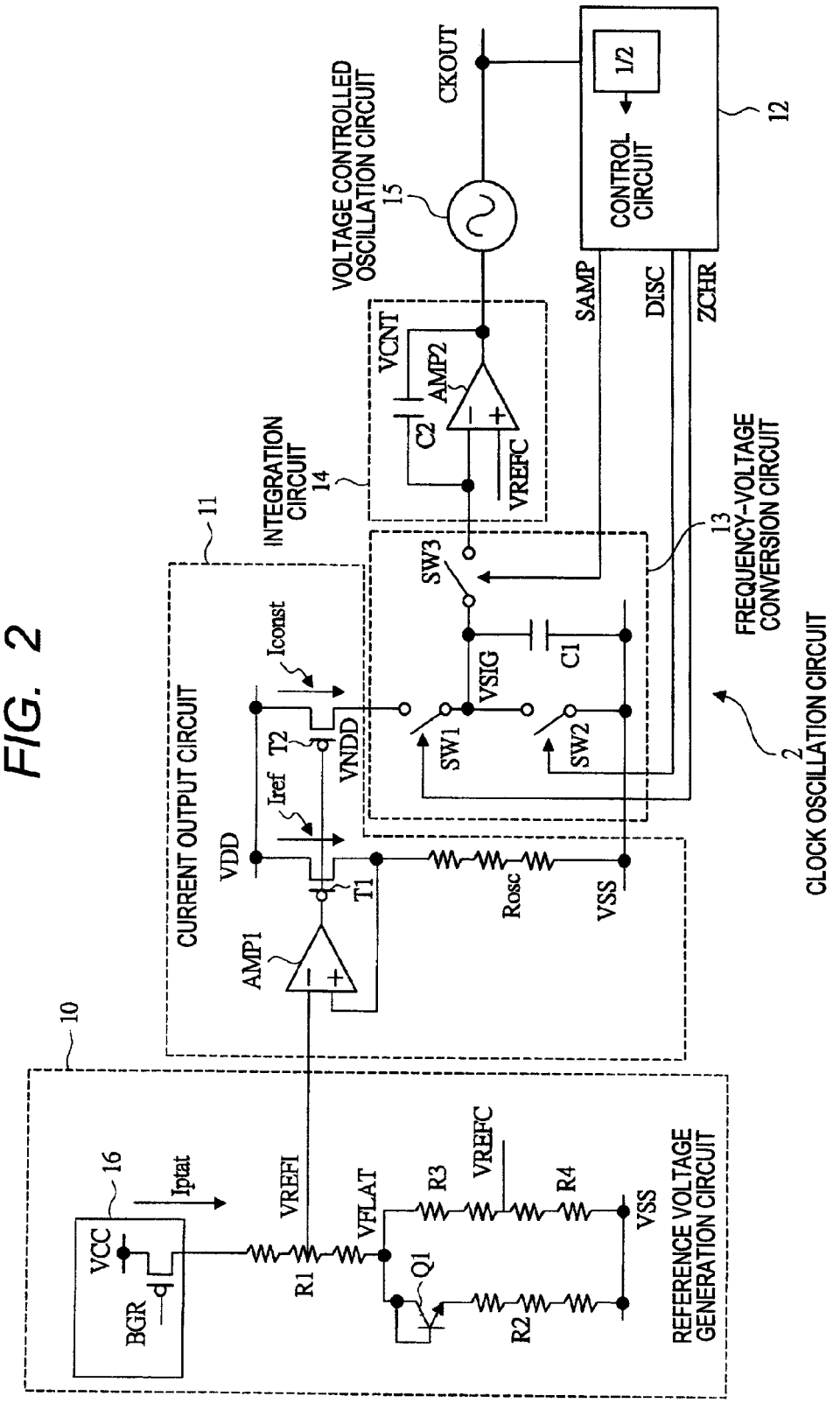
FIG. 2 is an illustrative view showing an example of a configuration in an oscillator portion provided in the semiconductor device of FIG. 1.
Figure 3:
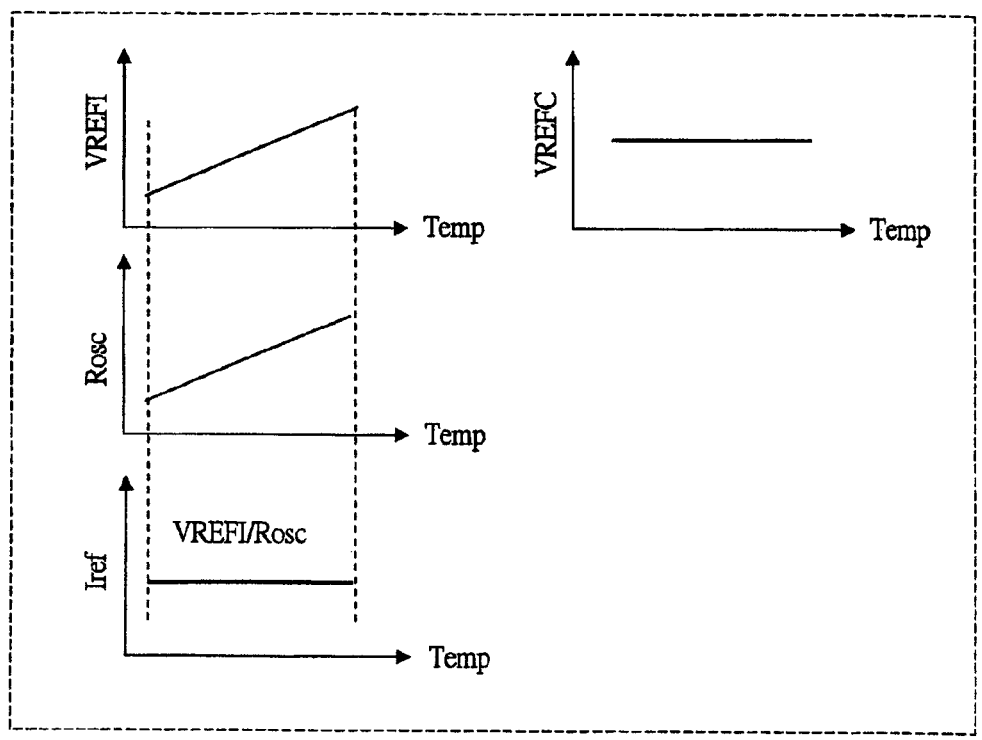
FIG. 3 is an illustrative view showing an example of the temperature dependence of a voltage generated by a reference voltage generation circuit provided in the oscillator portion of FIG. 2.
Figure 4:
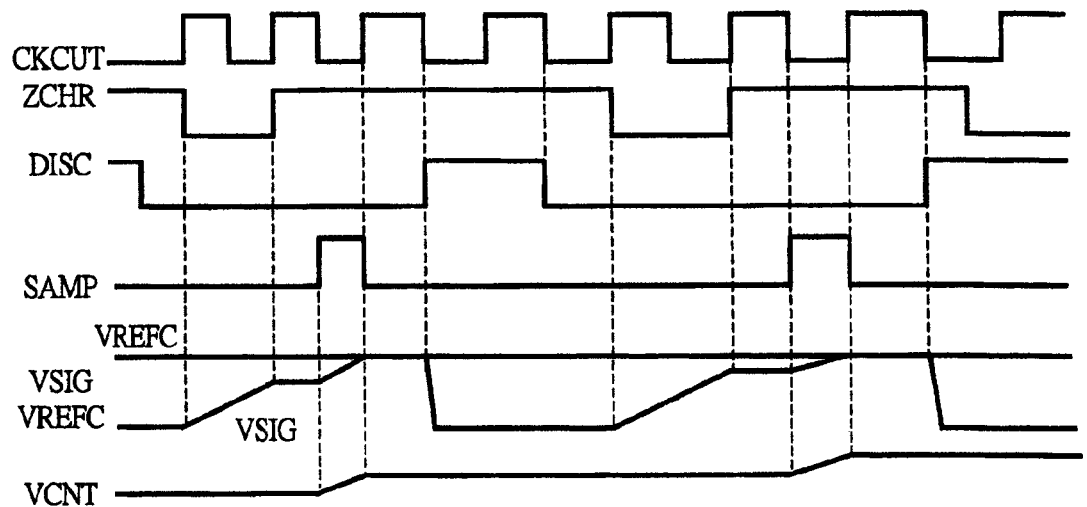
FIG. 4 is a timing chart showing an example of a process in which the oscillator portion of FIG. 2 adjusts a clock signal with a frequency faster than a targeted frequency.
Figure 5:
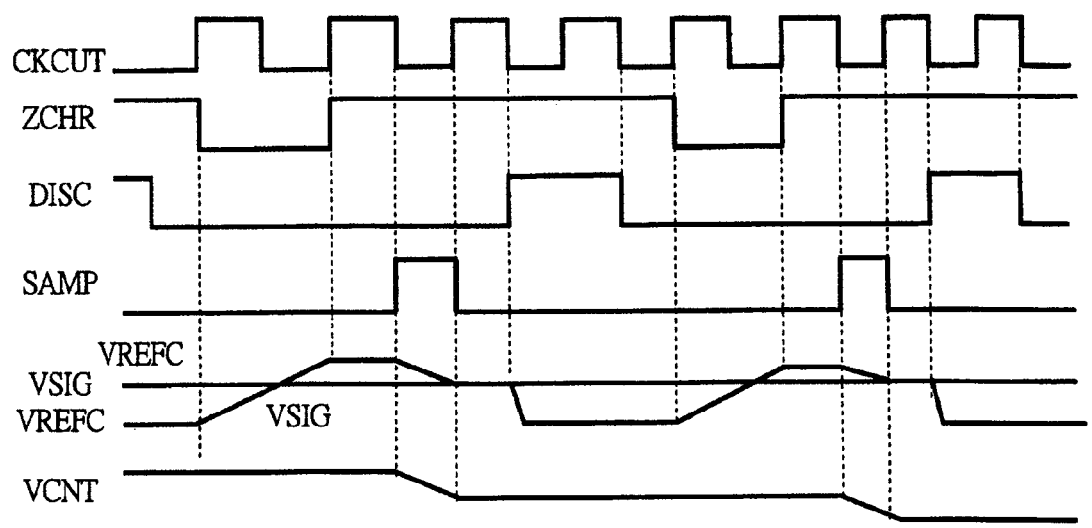
FIG. 5 is a timing chart showing an example of a process in which the oscillator portion of FIG. 2 adjusts the clock signal with a frequency slower than the targeted frequency.
Figure 6:
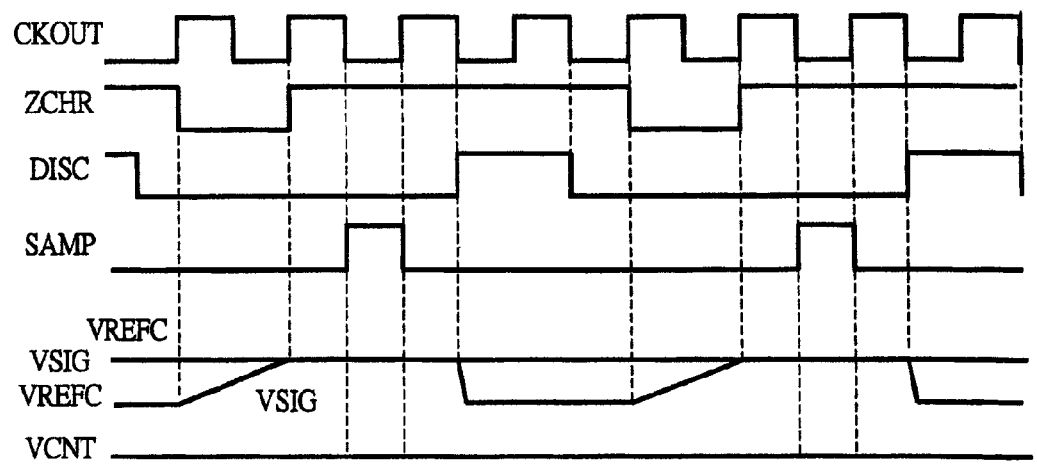
FIG. 6 is a timing chart showing an example of an operation when the oscillation frequency of the clock signal in the oscillator portion of FIG. 2 is equal to the targeted frequency.
Figure 7:
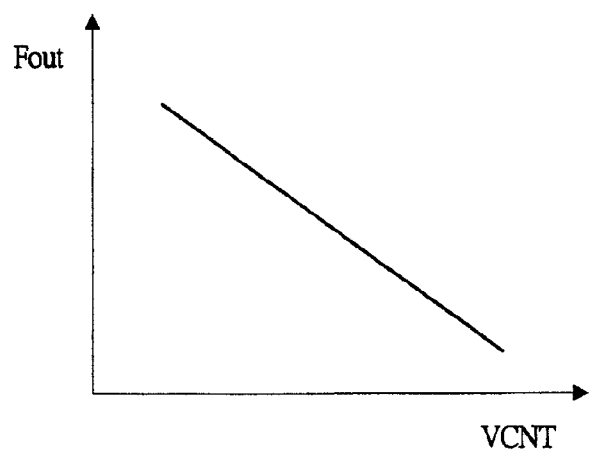
FIG. 7 is an illustrative view showing an example of a VF (Voltage-Frequency) characteristic of a voltage controlled oscillation circuit provided in the oscillator portion of FIG. 2.
Figure 8:
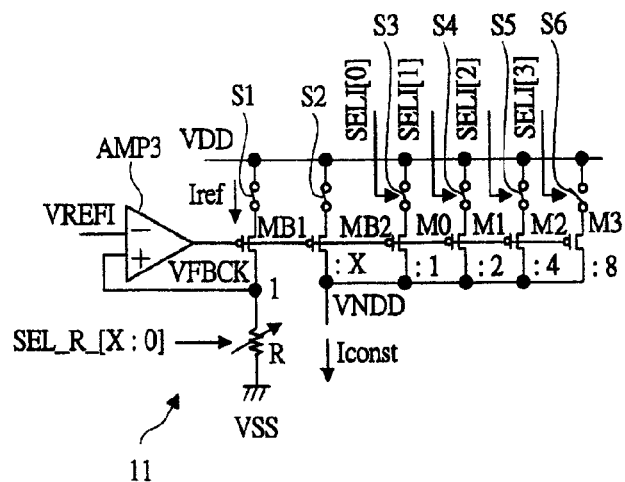
FIG. 8 is an illustrative view showing an example of a current generation circuit which changes a current mirror ratio using the transistor size examined by the present inventors to switch the frequency.
Figure 9:
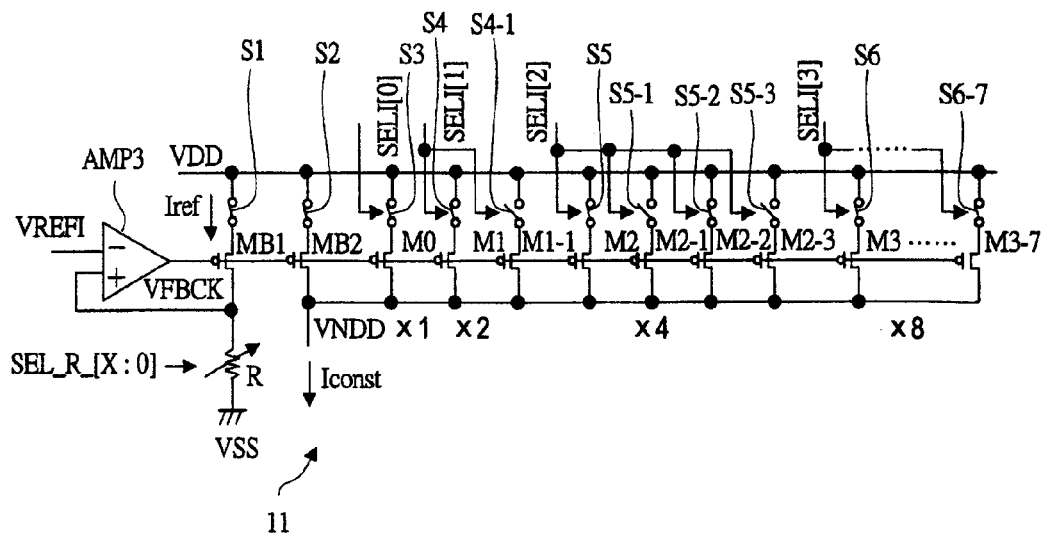
FIG. 9 is an illustrative view showing an example of the current generation circuit which changes the current mirror ratio using the number of transistors examined by the present inventors to switch the frequency.
Figure 10:
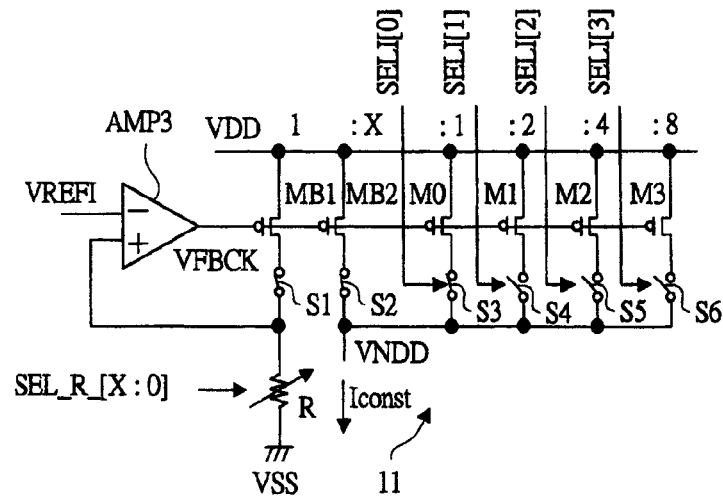
FIG. 10 is an illustrative view showing another example of the current generation circuit of FIG. 8.
Figure 11:
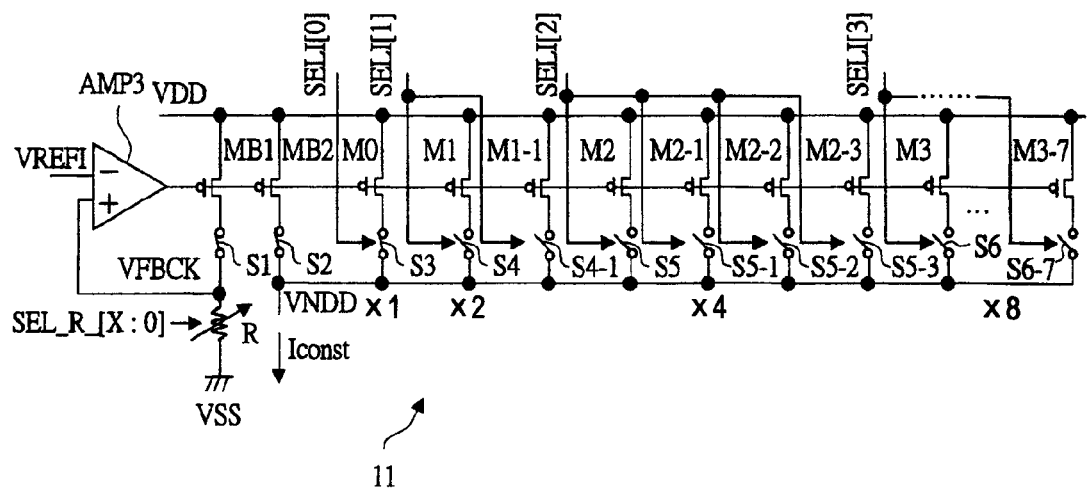
FIG. 11 is an illustrative view showing another example of the current generation circuit of FIG. 9.
Figure 12:
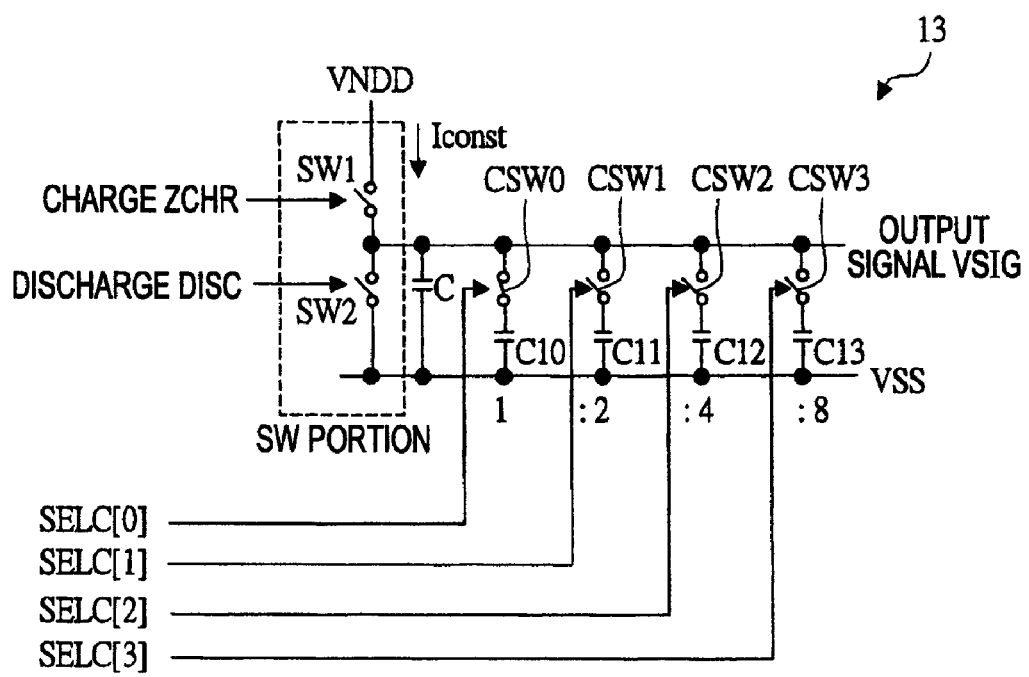
FIG. 12 is an illustrative view showing an example of a frequency-voltage conversion circuit having a frequency switching function using electrostatic capacitive elements according to Embodiment 1.
Figure 13:
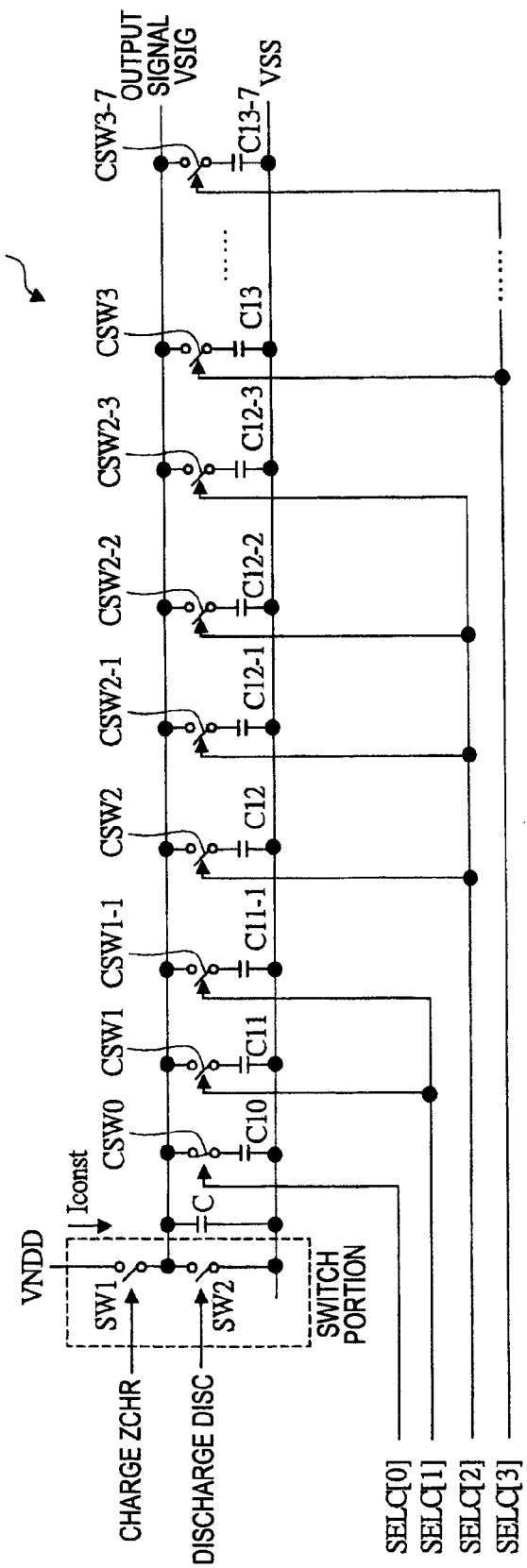
FIG. 13 is an illustrative view showing another example of the frequency-voltage conversion circuit having the frequency switching function using the electrostatic capacitive elements according to Embodiment 1.
Figure 14:
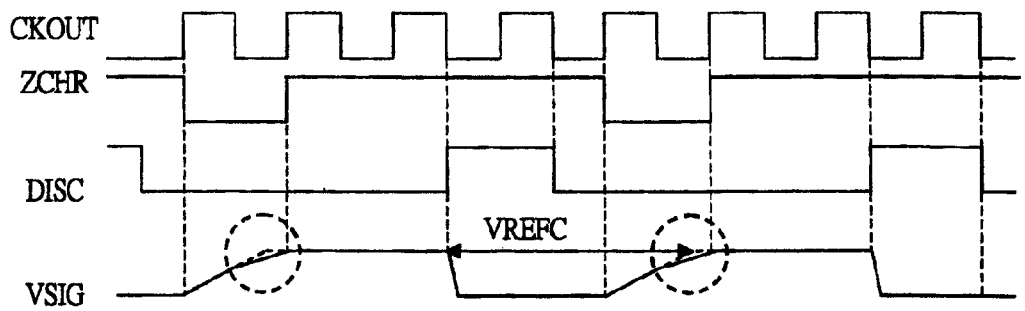
FIG. 14 is a timing chart showing an example of the operation of the frequency-voltage conversion circuit of FIG. 12.
Figure 15:
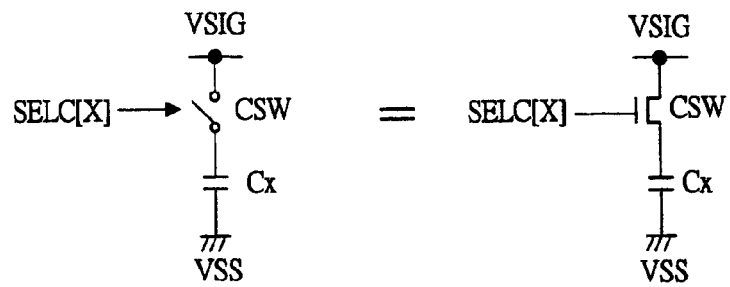
FIG. 15 is an illustrative view showing an example of a switch for selecting the electrostatic capacitive element provided in the frequency-voltage conversion circuit diagram of FIG. 12.
Figure 16:
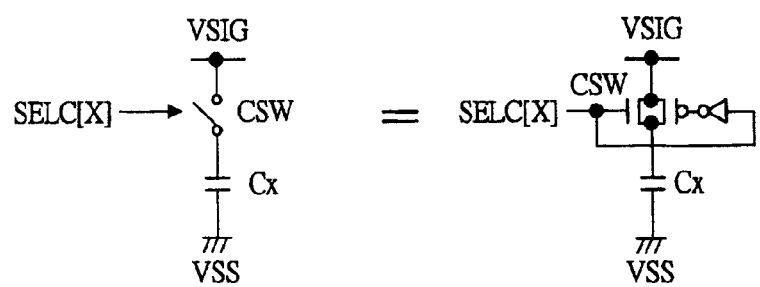
FIG. 16 is an illustrative view showing another example of the switch of FIG. 15.
Figure 17:
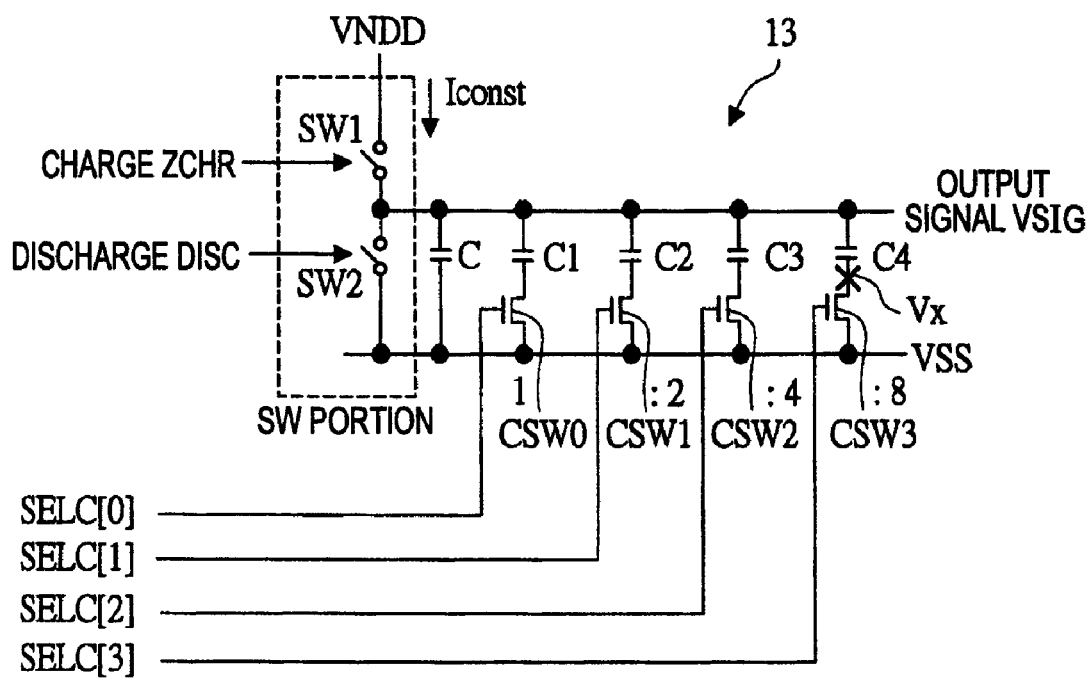
FIG. 17 is an illustrative view showing an example of the frequency-voltage conversion circuit in which the switches are provided on a negative electrode side.
Figure 18:
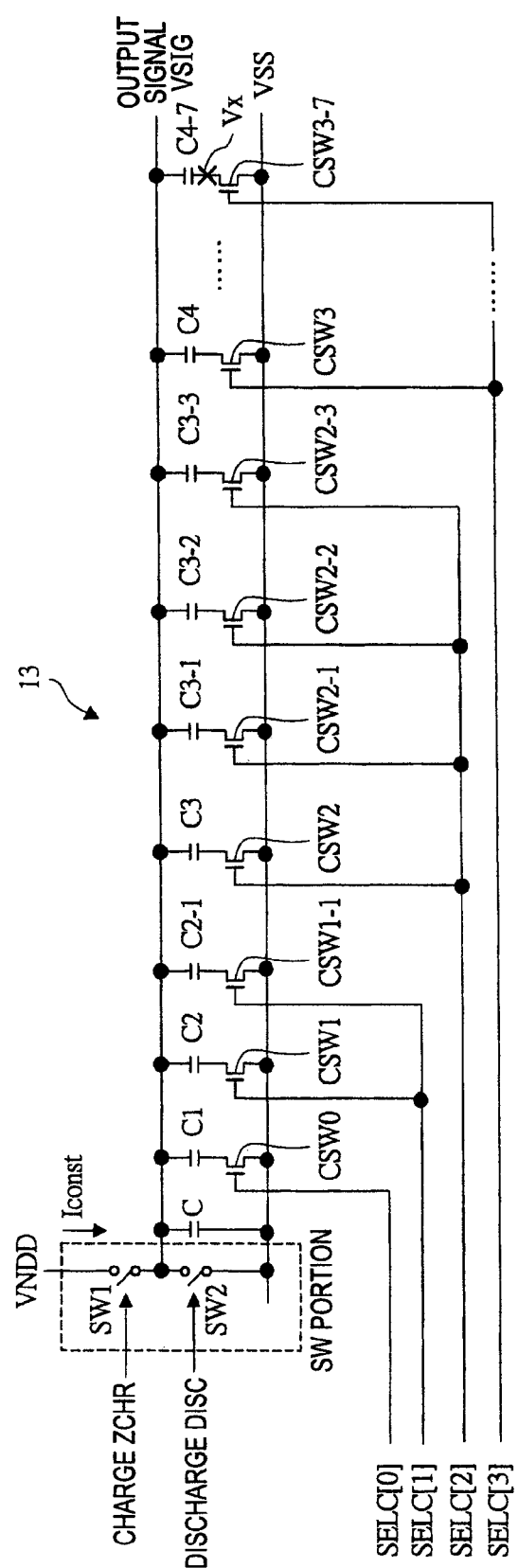
FIG. 18 is an illustrative view showing another example of the frequency-voltage conversion circuit of FIG. 17.
Figure 19:
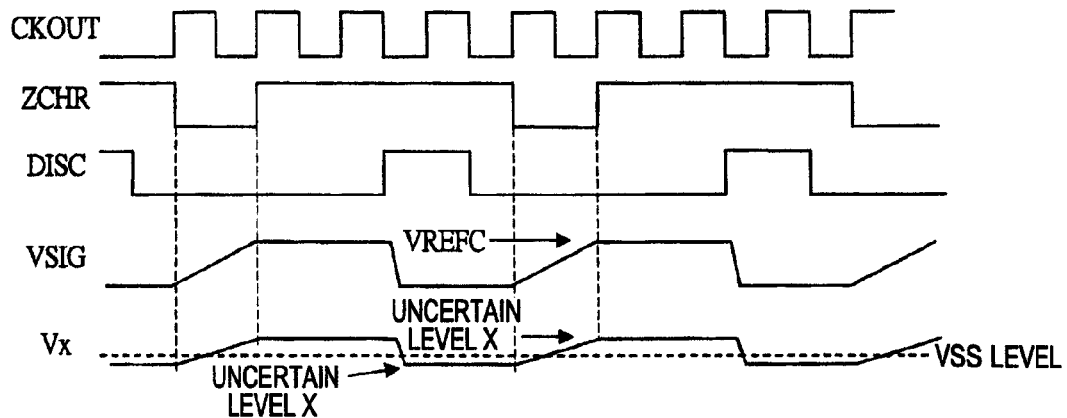
FIG. 19 is a timing chart showing an example of an operation waveform at a node Vx in the frequency-voltage conversion circuit of FIG. 17.
Figure 20:
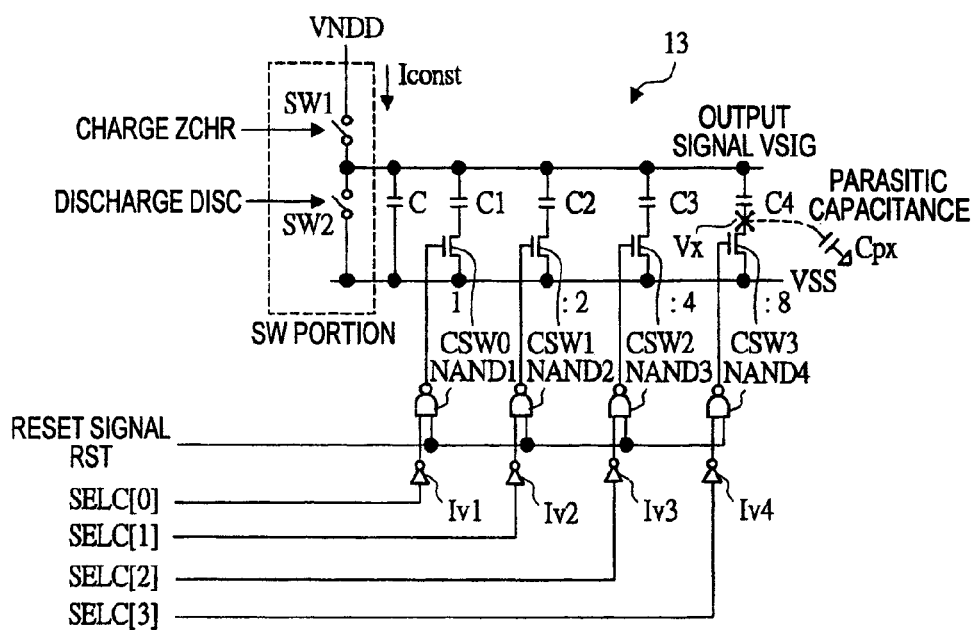
FIG. 20 is an illustrative view showing an example of the frequency-voltage conversion circuit having the function of refreshing a node which becomes uncertain to a reference potential level.
Figure 21:
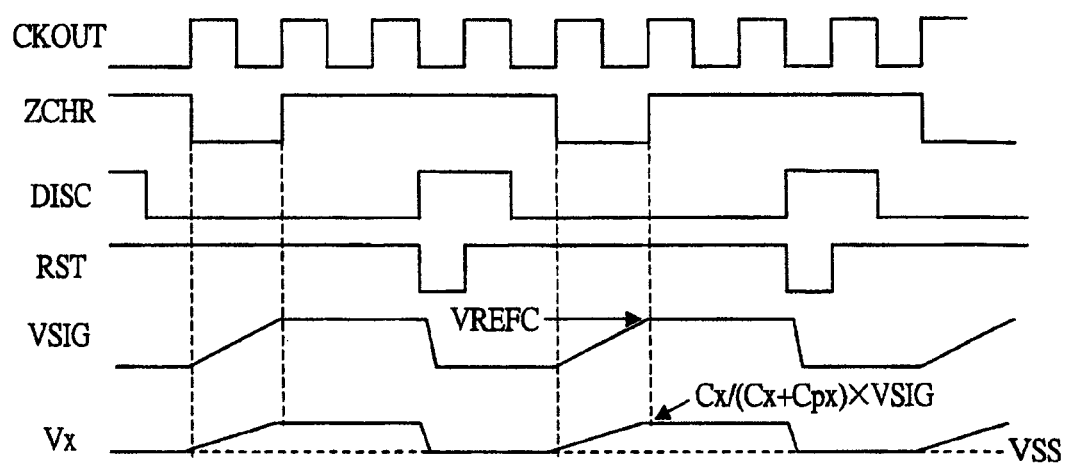
FIG. 21 is a timing chart showing an example of the operation of the frequency-voltage conversion circuit of FIG. 20.
Figure 22:
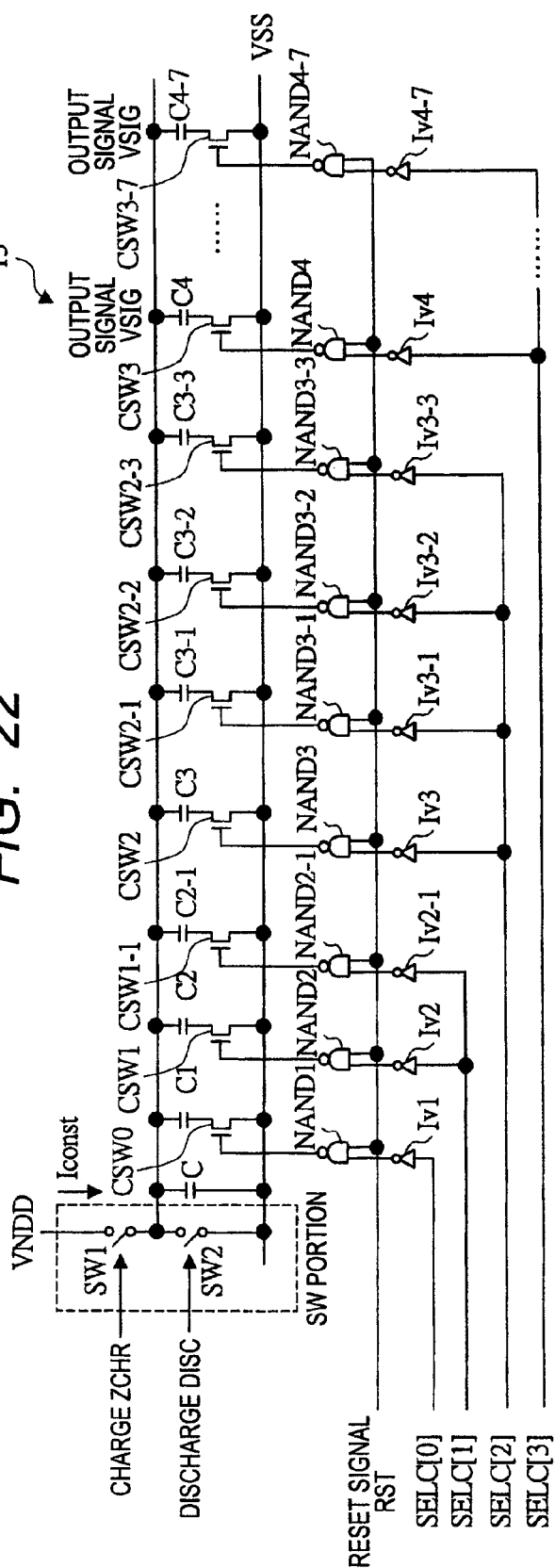
FIG. 22 is an illustrative view showing an example when the refreshing function is applied to the frequency-voltage conversion circuit of FIG. 18.
Figure 23:
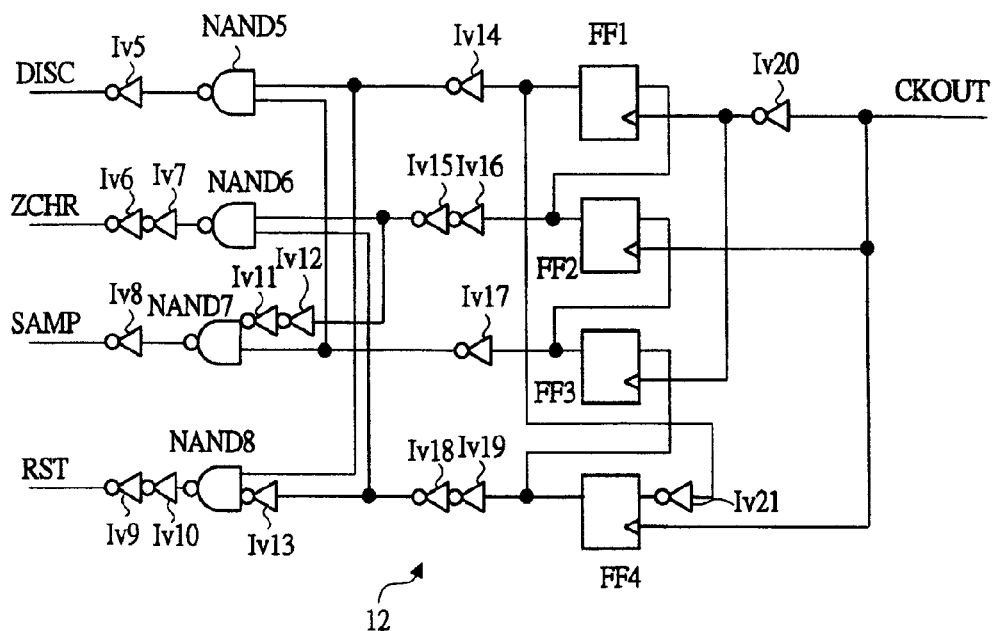
FIG. 23 is an illustrative view showing an example of a control circuit for controlling the frequency-voltage conversion circuit of FIG. 20.
Figure 24:
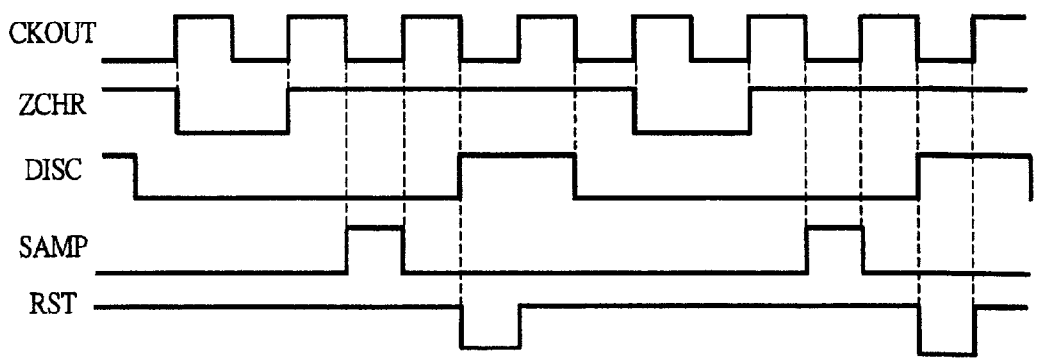
FIG. 24 is a timing chart of individual signals in the control circuit of FIG. 23.
Figure 25:
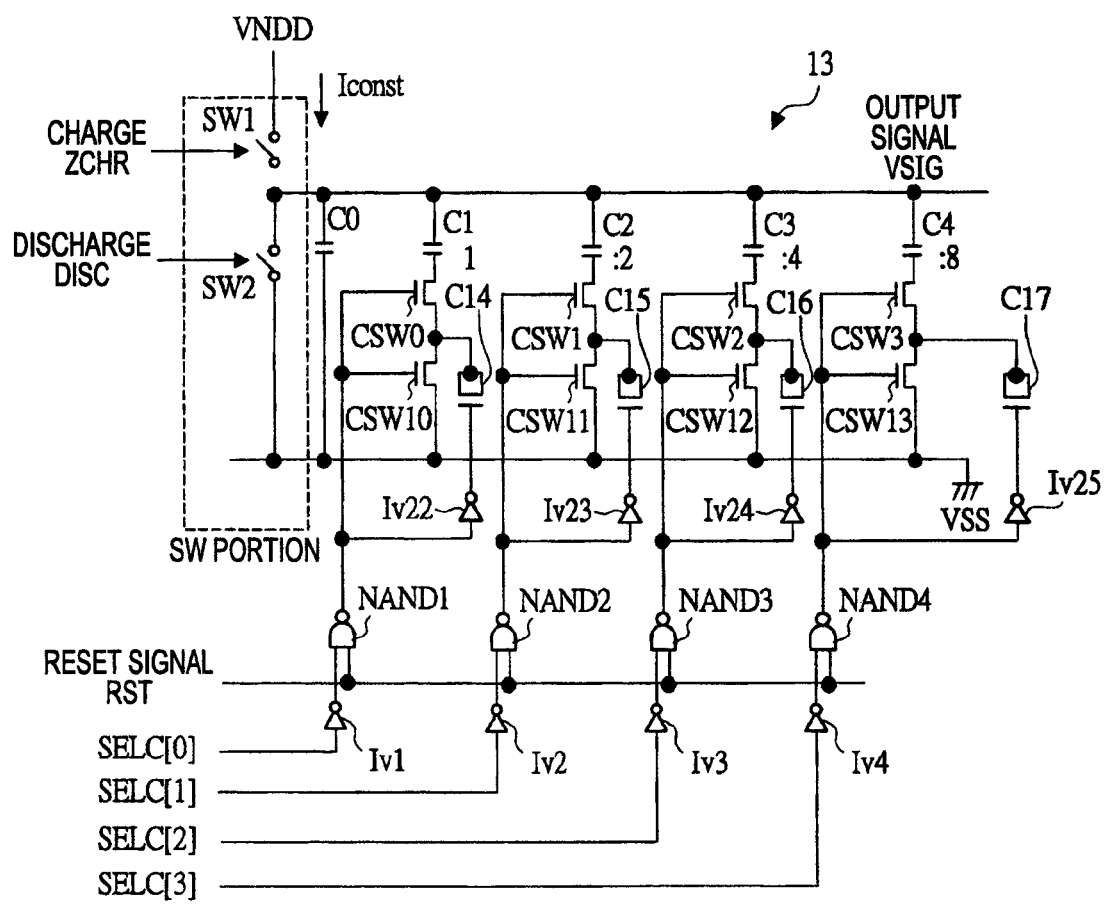
FIG. 25 is an illustrative view showing another circuit configuration of the frequency-voltage conversion circuit of FIG. 20.
Figure 26:
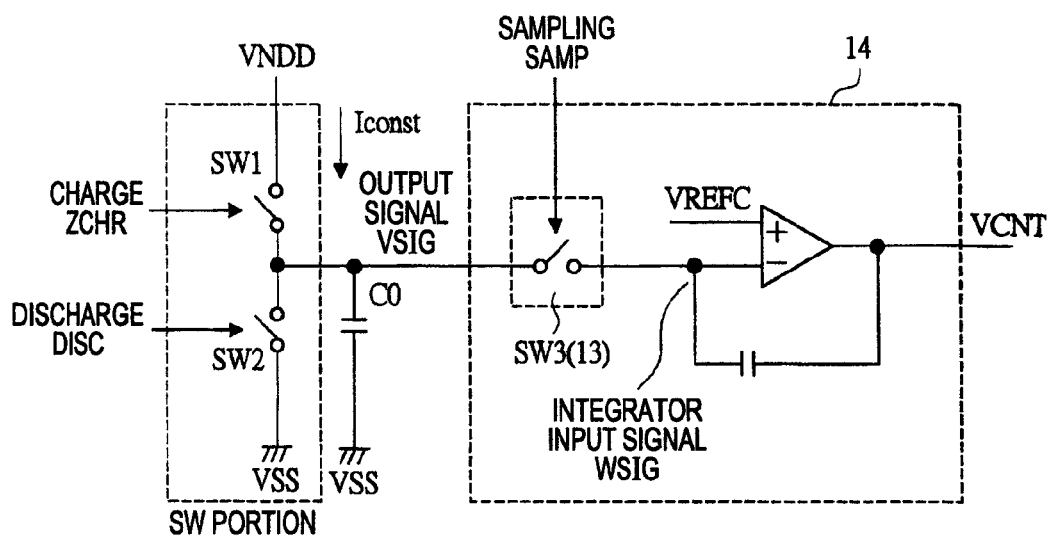
FIG. 26 is an illustrative view showing an example of coupling between the frequency-voltage conversion circuit and an integration circuit.
Figure 27:
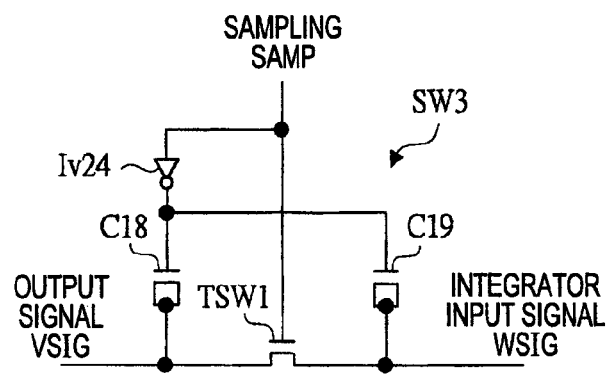
FIG. 27 is an illustrative view showing an example of switches provided in the integration circuit of FIG. 26.
Figure 28:
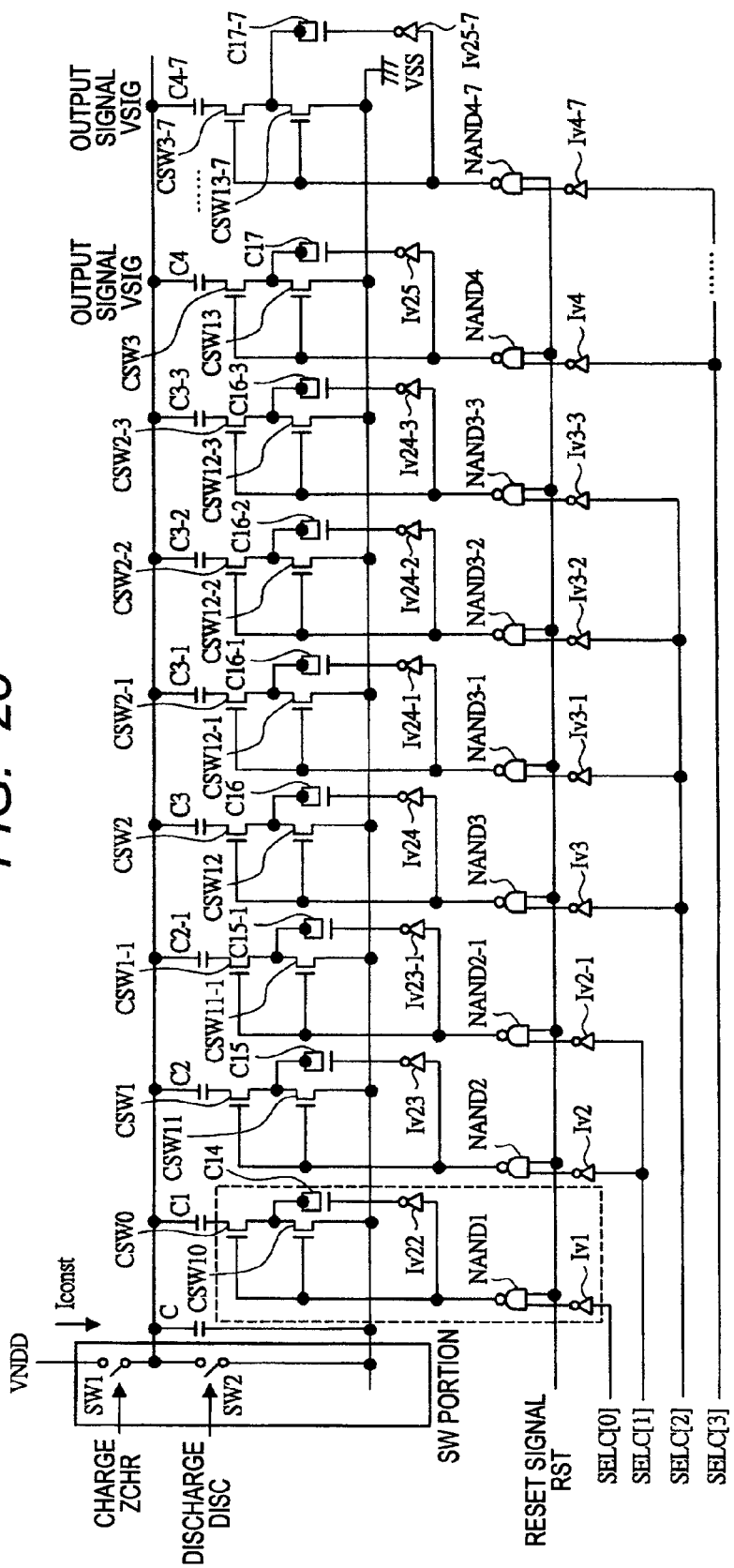
FIG. 28 is an illustrative view showing another circuit configuration of the frequency-voltage conversion circuit of FIG. 22.
Figure 29:
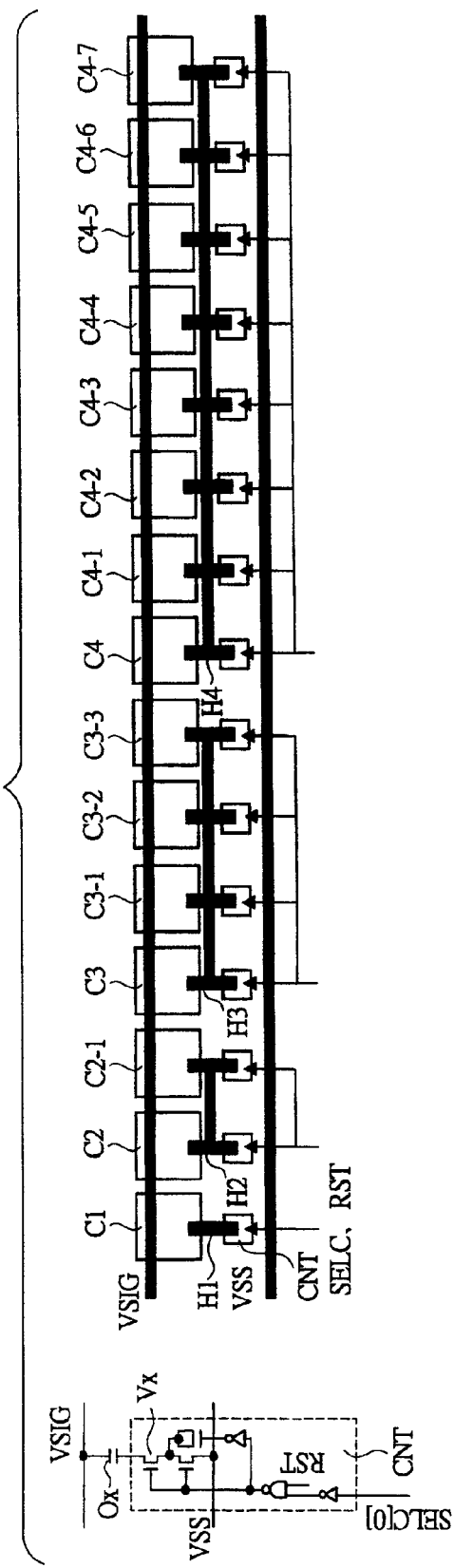
FIG. 29 is an illustrative view showing an example of a layout which minimizes a parasitic capacitance in the frequency-voltage conversion circuit of FIG. 28.

FIG. 1 is a block diagram showing an example of a structure of a semiconductor device according to Embodiment 1 of the present invention. FIG. 2 is a block diagram view showing an example of a configuration in an oscillator portion provided in the semiconductor device of FIG. 1. FIG. 3 is an illustrative view showing an example of the temperature dependence of a voltage generated by a reference voltage generation circuit provided in the oscillator portion of FIG. 2. FIG. 4 is a timing chart showing an example of a process in which the oscillator portion of FIG. 2 adjusts a clock signal with a frequency faster than a targeted frequency. FIG. 5 is a timing chart showing an example of a process in which the oscillator portion of FIG. 2 adjusts the clock signal with a frequency slower than the targeted frequency. FIG. 6 is a timing chart showing an example of an operation when the oscillation frequency of the clock signal in the oscillator portion of FIG. 2 is equal to the targeted frequency. FIG. 7 is an illustrative view showing an example of a VF characteristic of a voltage controlled oscillation circuit provided in the oscillator portion of FIG. 2. FIG. 8 is an illustrative view showing an example of a current generation circuit which changes a current mirror ratio using the transistor size examined by the present inventors to switch the frequency. FIG. 9 is an illustrative view showing an example of the current generation circuit which changes the current mirror ratio using the number of the transistors examined by the present inventors to switch the frequency. FIG. 10 is an illustrative view showing another example of the current generation circuit of FIG. 8. FIG. 11 is an illustrative view showing another example of the current generation circuit of FIG. 9. FIG. 12 is an illustrative view showing an example of a frequency-voltage conversion circuit having a frequency switching function using the electrostatic capacitive elements according to Embodiment 1. FIG. 13 is an illustrative view showing another example of the frequency-voltage conversion circuit having the frequency switching function using the electrostatic capacitive elements according to Embodiment 1. FIG. 14 is a timing chart showing an example of the operation of the frequency-voltage conversion circuit of FIG. 12. FIG. 15 is an illustrative view showing an example of the switch for selecting the electrostatic capacitive element provided in the frequency-voltage conversion circuit diagram of FIG. 12. FIG. 16 is an illustrative view showing another example of the switch of FIG. 15. FIG. 17 is an illustrative view showing an example of the frequency-voltage conversion circuit in which the switches are provided on a negative electrode side. FIG. 18 is an illustrative view showing another example of the frequency-voltage conversion circuit of FIG. 17. FIG. 19 is a timing chart showing an example of an operation waveform at a node in the frequency-voltage conversion circuit of FIG. 17. FIG. 20 is an illustrative view showing an example of the frequency-voltage conversion circuit having the function of refreshing a node Vx which becomes uncertain to a reference potential level. FIG. 21 is a timing chart showing an example of the operation of the frequency-voltage conversion circuit of FIG. 20. FIG. 22 is an illustrative view showing an example when the refreshing function is applied to the frequency-voltage conversion circuit of FIG. 18. FIG. 23 is an illustrative view showing an example of the control circuit for controlling the frequency-voltage conversion circuit of FIG. 20. FIG. 24 is a timing chart of individual signals in the control circuit of FIG. 23. FIG. 25 is an illustrative view showing another circuit configuration of the frequency-voltage conversion circuit of FIG. 20. FIG. 26 is an illustrative view showing an example of coupling between the frequency-voltage conversion circuit and an integration circuit. FIG. 27 is an illustrative view showing an example of switches provided in the integration circuit of FIG. 26. FIG. 28 is an illustrative view showing another circuit configuration of the frequency-voltage conversion circuit of FIG. 22. FIG. 29 is an illustrative view showing an example of a layout which minimizes a parasitic capacitance in the frequency-voltage conversion circuit of FIG. 28.

In Embodiment 1, as shown in FIG. 1, the semiconductor device 1 includes the clock oscillation circuit 2, a register 3, a memory 4, a frequency divider circuit 5, a CPU 6, an A/D converter 7, a timer 8, a peripheral circuit 9, and the like.

The clock oscillation circuit 2 serving as a clock oscillation means generates the clock signal supplied to the internal modules of the semiconductor device 1. The frequency divider circuit 5 varies the clock signal generated by the clock oscillation circuit 2 by dividing the frequency thereof, and supplies the varied clock signal as an operation clock to the internal modules such as the frequency divider circuit 5, the CPU 6, the A/D converter 7, and the timer 8 and the peripheral circuit 9 as one of the other modules.

The CPU 6 controls operations in the semiconductor device 1. The A/D converter 7 converts an analog signal to a digital signal. The timer 8 counts up a timer clock or the like to make desired time settings, and outputs a timer counter signal when a given time is reached.

The memory 4 is formed of a nonvolatile memory exemplified by a flash memory, and stores control signals after trimming from the clock oscillation circuit 2. Upon activation of the semiconductor device 1, the control signals stored in the memory 4 are read and stored into the register 3.

The operation of the clock oscillation circuit 2 is controlled based on the control signals stored in the register 3. The control signals stored in the memory 4 include temperature trimming signals VCNTL_VREFI and VCNTL_VREFC, frequency adjustment control signals SELI and SELC as adjustment signals for achieving the targeted frequency, and the like.

FIG. 2 is a block diagram showing an example of the configuration in the clock oscillation circuit 2.

As shown in the drawing, the clock oscillation circuit 2 is comprised of the reference voltage generation circuit 10, the current output circuit 11, the control circuit 12, the frequency-voltage conversion circuit 13, and an oscillation circuit including an integration circuit 14 and a voltage controlled oscillation circuit 15, and is a clock generation circuit in which these circuits form a feedback loop.

The reference voltage generation circuit 10 includes a band gap reference circuit BGR, resistors R1 to R4, and a transistor Q1 formed of a bipolar element. The current output circuit 11 includes an operational amplifier AMP1 and transistors T1 and T2 each formed of a P-channel MOS transistor.

The frequency-voltage conversion circuit 13 includes switches SW1 to SW3 and an electrostatic capacitive element C1. The integration circuit 14 includes an operational amplifier AMP2 and an electrostatic capacitive element C2.

The reference voltage generation circuit 10 generates a reference voltage VREFI having a temperature characteristic as shown in the upper left-hand portion of FIG. 3, and a reference voltage VREFC having no power-supply/temperature dependence as shown on the right-hand side of FIG. 3.

In the reference voltage generation circuit 10, the band gap reference circuit BGR is a circuit as a reference voltage source which generates a voltage showing a small change in response to a temperature change. Here, the band gap reference circuit BGR generates a current Iptat having positive primary temperature dependence. Note that the voltage change in response to the temperature change is smaller than, e.g., a change in the saturation current of a MOS transistor in response to a temperature change.

To the output portion of the band gap reference circuit BGR, one coupling portion of the register R1 is coupled. A voltage generated in the resistor R1 is the reference voltage VREFI, which is outputted to the current output circuit 11.

To the other coupling portion of the resistor R1, the collector and base of the transistor Q1 and one coupling portion of the resistor R3 are each coupled. To the emitter of the transistor Q1, one coupling portion of the resistor R2 is coupled. To the other coupling portion of the resistor R2, a reference potential VSS is coupled.

To the other coupling portion of the resistor R3, one coupling portion of the resistor R4 is coupled. To the other coupling portion of the resistor R4, the reference potential VSS is coupled. The voltage generated at the coupling portion between the resistors R3 and R4 is outputted as the reference voltage VREFC to the integration circuit 14.

The current output circuit 11 generates a current Iref having small power-supply/temperature dependence as shown in the lower left-hand portion of FIG. 3. The constant current Iref is generated in a voltage follower circuit using the operational amplifier AMP1 by applying the reference voltage VREFI to a resistor Rosc having temperature dependence as shown in the middle left-hand portion of FIG. 3. At this time, to cancel out the temperature dependence of the resistance Rosc, in the reference voltage generation circuit 10, the reference voltage VREFI is provided with a temperature characteristic.

To the negative (−) input terminal of the operational amplifier AMP1, the reference voltage VREFI is coupled to be inputted thereto. To the output portion of the operational amplifier AMP1, the gates of the transistors T1 and T2 are each coupled.

To each of the sources of the transistors T1 and T1, a power supply voltage VDD is coupled to be supplied thereto. To the drain of the transistor T1, the positive (+) input terminal of the operational amplifier AMP1 and one coupling portion of the resistor Rosc are each coupled.

To the other coupling portion of the resistor Rosc, the reference potential VSS is coupled. From the other coupling portion of the transistor T2, a current Iconst is outputted. From the drain of the transistor T2, a voltage VNDD is supplied to the switch SW1 of the frequency-voltage conversion circuit 13.

The frequency-voltage conversion circuit 13 generates, based on a control signal ZCHR generated in the control circuit 12, a voltage VSIG from the current Iconst (M·Iref), the capacitance of the electrostatic capacitive element C1, and a clock signal CKOUT outputted from the voltage controlled oscillation circuit 15. The control signal ZCHR is a signal having a pulse width equal to the frequency of the clock signal CKOUT.

In the frequency-voltage conversion circuit 13, to one coupling portion of the switch SW1, the voltage VNDD is coupled to be supplied thereto. To the other coupling portion of the switch SW1, one coupling portion of the switch SW2, one coupling portion of the switch SW3, and one coupling portion of the electrostatic capacitive element C1 are each coupled. To each of the other coupling portions of the switch SW2 and the electrostatic capacitive element C1, the reference potential VSS is coupled.

The ON/OFF (conductive/non-conductive) state of the switch SW1 is controlled based on the control signal ZCHR outputted from the control circuit 12. The ON/OFF (conductive/non-conductive) state of the switch SW2 is controlled based on a control signal DISC outputted from the control circuit 12. The ON/OFF (conductive/non-conductive) state of the switch SW3 is controlled based on a control signal SAMP similarly outputted from the control circuit 12.

The integration circuit 14 is formed of, e.g., a parallel-switched-capacitor integration circuit, and samples the voltage VSIG. The integration circuit 14 generates a control voltage VCNT such that the reference voltage VREFC having small power-supply/temperature dependence is equal to the voltage VSIG outputted from the frequency-voltage conversion circuit 13.

To the negative (−) input terminal of the operational amplifier AMP2 and one coupling portion of the electrostatic capacitive element C2, the voltage VSIG outputted from the other coupling portion of the switch SW3 is coupled to be inputted thereto.

To the positive (+) input terminal of the operational amplifier AMP2, the reference voltage VREFC is coupled to be inputted thereto. To the output portion of the operational amplifier AMP2, the other coupling portion of the electrostatic capacitive element C2 is coupled, and outputted as the control voltage VCNT to the voltage controlled oscillation circuit 15.

The voltage controlled oscillation circuit 15 adjusts the clock signal CKOUT based on the control voltage VCNT inputted thereto such that the clock signal CKOUT has a desired frequency. The clock signal CKOUT generated by the voltage controlled oscillation circuit 15 is also coupled to the control circuit 12 to be inputted thereto.

Here, an oscillation frequency Tckout of the clock signal CKOUT generated in the clock oscillation circuit 2 is determined by a time required to charge the both-end voltage of the capacitance of the electrostatic capacitive element C1 of the frequency-voltage conversion circuit 13 from 0 V to the voltage VREFC with the reference current Iconst (M·Iref) generated by the current output circuit 11, which can be represented by the following expression (3).

$$Tckout=(C \cdot VREFC)/(VREFI/R)=(C1 \cdot Rosc \cdot VREFC)/VREFI \quad (3)$$

For the clock oscillation circuit 2 to output the clock signal CKOUT having no temperature/power-supply dependence, a mechanism for cancelling out the temperature dependence of each of the electrostatic capacitive element C1 and the resistor Rosc is required.

To satisfy the requirement, the reference voltage generation circuit 10 generates the reference voltage for cancelling out the temperature dependence of each of the electrostatic capacitive element C1 and the resistor Rosc. As shown in the expression (1), the reference voltage VREFI is a voltage having a temperature characteristic which cancels out the temperature dependence resulting from the product between the capacitance of the electrostatic capacitive element C1 and the resistance of the resistor Rosc, and the reference voltage VREFC needs to be a voltage having no temperature dependence.

Temperature trimming is performed by monitoring the output frequency of the clock signal CKOUT, and typically performed at a room temperature and a high temperature. The voltage value of the reference voltage VREFI is switched such that oscillation frequencies monitored at the two temperatures are equal, and the control signal with which the frequencies are equal is preliminarily written and stored in the memory 4.

Next, using FIGS. 4 to 6, a description will be given of a process in which the clock oscillation circuit 2 adjusts the clock signal CKOUT to a desired frequency.

FIG. 4 is a timing chart showing an example of the case where the oscillation frequency of the clock signal CKOUT is faster than a targeted frequency. FIG. 5 is a timing chart showing an example of the case where the oscillation frequency of the clock signal CKOUT is slower than the targeted frequency. FIG. 6 is a timing chart showing an example of the case where the oscillation frequency of the clock signal CKOUT is equal to the targeted frequency.

In FIGS. 4 to 6, there are downwardly shown signal timings for the clock signal CKOUT, the control signal ZCHR outputted from the control circuit 12, the control signal DISC outputted from the control circuit 12, the control signal SAMP outputted from the control circuit 12, the voltage VSIG generated by the frequency-voltage conversion circuit 13, the reference voltage VREFC generated by the reference voltage generation circuit 10, and the control voltage VCNT generated by the integration circuit 14.

The oscillation frequency Tckout of the clock generated in the clock oscillation circuit 2 is determined by a time required to charge the both-end voltage in the electrostatic capacitive element C1 of the frequency-voltage conversion circuit 13 from 0 V to the reference voltage VREFC with the reference current Iconst (M·Iref) generated by the current output circuit 11.

When the frequency of the clock signal CKOUT is faster than the targeted frequency, during the period of the oscillation frequency Tckout, the voltage VSIG generated at the both ends of the electrostatic capacitive element C1 by charging the electrostatic capacitive element C1 with the reference current Iconst has a value lower than that of the reference voltage VREFC, as shown in FIG. 4.

In the integration circuit 14 functioning as a comparator between two voltages which are the voltage VSIG outputted from the frequency-voltage conversion circuit 13 and the reference voltage VREFC, charge sharing occurs between the electrostatic capacitive elements C1 and C2 such that, during a sampling period (SAMP=Hi), virtually grounded differential inputs (the reference voltage VREFC and the voltage VSIG) are equal.

When the frequency of the clock signal CKOUT is fast, charges move from the electrostatic capacitive element C2 to the electrostatic capacitive element C1, and the control voltage VCNT inputted to the voltage controlled oscillation circuit 15 rises (FIG. 7 shows an example of the VF characteristic of the voltage controlled oscillation circuit). The voltage controlled oscillation circuit 15 has a negative characteristic with respect to the control voltage VCNT so that the oscillation frequency thereof becomes slow.

Conversely, when the oscillation frequency of the clock signal CKOUT is slower than the targeted frequency, as a result of charging the electrostatic capacitive element C1 during the period of the oscillation frequency Tckout, the voltage VSIG has a value higher than that of the reference voltage VREFC, as shown in FIG. 5.

As a result of the charge sharing between the electrostatic capacitive elements C1 and C2, charges move from the electrostatic capacitive element C1 to the electrostatic capacitive element C2 so that the control voltage VCNT lowers. As a result, the oscillation frequency of the clock signal CKOUT becomes faster.

Subsequently, when the oscillation frequency of the clock signal CKOUT is equal to the targeted frequency, as shown in FIG. 6, the voltage VSIG is equal to the reference voltage VREFC after charging. As a result, no movement of charges occurs between the electrostatic capacitive elements C1 and C2 to provide a frequency locked state, and allow a certain operation to be obtained.

FIG. 8 is an illustrative view showing an example of the current output circuit 11 examined by the present inventor.

In general, an oscillator provided in a semiconductor device implements the switching of a frequency by switching a current mirror ratio in a current circuit and changing a constant current value.

In this case, as shown in the drawing, the current output circuit 11 includes an operational amplifier AMP3, MOS transistors MB1 and MB2, MOS transistors M0 to M3, a resistor R, and switches S1 to S6. The transistors MB1, MB2, and M0 to M3 are formed of P-channel MOS transistors.

To the negative (−) input terminal of the operational amplifier AMP3, the reference voltage VREFI is inputted. To each of the gates of the MOS transistors MB1, MB2, and M0 to M3, the output portion of the operational amplifier AMP3 is coupled.

The switches S1 to S6 are formed of, e.g., P-channel MOS transistors or the like. To one coupling portion of each of the switches S1 to S6, the power supply voltage VDD is coupled. To the other coupling portions of the switches S1 to S6, one portions of the transistors MB1, MB2, and M0 to M3 are respectively coupled.

To the other coupling portion of the transistor MB1, one coupling portion of the resistor R and the positive (+) input terminal of the operational amplifier AMP3 are each coupled. To the other coupling portion of the resistor R, the reference potential VSS is coupled.

The respective other couplings portions of the transistors MB2 and M0 to M3 are commonly coupled and, to the respective control terminals of the switches S3 to S6, frequency adjustment control signals SELI0 to SELI3 are coupled to be inputted thereto.

FIG. 9 shows a variation of FIG. 8. The current output circuit 11 has a configuration obtained by adding transistors M1-1, M2-1 to M2-3, and M3-1 to M3-7 and switches S4-1, S5-1 to S5-3, and S6-1 to S6-7 to the configuration of FIG. 8 including the operational amplifier AMP3, the transistors MB1 and MB2, the transistors M0 to M3, the resistor R, and the switches S1 to S6. The transistors M1-1, M2-1 to M2-3, and M3-1 to M3-7 are formed of P-channel MOS transistors.

To the control terminal of the switch S4-1, the frequency adjustment control signal SEM is coupled to be inputted thereto. To each of the switches S5-1 to S5-3, the frequency adjustment control signal SELI2 is coupled to be inputted thereto.

To each of the switches S6-1 to S6-7, the frequency adjustment control signal SELI3 is coupled to be inputted thereto. To each of one coupling portions of the switches S4-1, S5-1 to S5-3, and S6-1 to S6-7, the power supply voltage VDD is coupled.

To the other coupling portions of the switches S4-1, S5-1 to S5-3, and S6-1 to S6-7, one coupling portions of the transistors M1-1, M2-1 to M2-3, and M3-1 to M3-7 are respectively coupled. The other coupling portions of the transistors M1-1, M2-1 to M2-3, and M3-1 to M3-7 are commonly coupled. The coupling configuration is otherwise the same as that of the current output circuit 11 of FIG. 8.

In this case, by using the reference voltage VREFI generated by the reference voltage generation circuit 10 as an input voltage to the voltage follower circuit and setting the coupling portion (node VFBCK) between the transistor MB1 and the resistor R at the voltage level of the reference voltage VREFI, the constant current Iref=VREFI/R is generated.

Then, by switching the generated current using the current mirror circuit including the transistors M0 to M3, the frequency is changed.

When the current Iconst is increased, the oscillation frequency becomes faster. Conversely, when the current Iconst is reduced, the oscillation frequency becomes slower. The mirror ratio is switched by controlling the size of the gate width W of each of the transistors M0 to M3, as shown in FIG. 8, or controlling the number of couplings between unit devices, as shown in FIG. 9. At this time, if the mirror ratio is weighted with 2, control convenience is obtained, but the mirror ratio need not necessarily be weighted with 2.

In the configuration of FIG. 8, the switches S1 to S6 are coupled between the power supply voltage VDD and the respective one coupling portions of the transistors MB1, MB2, and M0 to M3. However, as shown in FIG. 10, the configuration may also be such that the respective one coupling portions of the switches S2 to S6 are coupled to the other coupling portions of the transistors MB2 and M0 to M3, and the other coupling portions of the switches S2 to S6 are commonly coupled. The coupling configuration is otherwise the same as in FIG. 8.

In the configuration of FIG. 9 also, the switches S1 to S6, S4-1, S5-1 to S5-3, and S6-1 to S6-7 are coupled between the power supply voltage VDD and the respective one coupling portions of the transistors MB1, MB2, M0 to M3, M1-1, M2-1 to M2-3, and M3-1 to M3-7. However, the configuration may also be such that the respective one coupling portions of the switches S2 to S6, S4-1, S5-1 to S5-3, S6-1 to S6-7 are coupled to the other coupling portions of the transistors MB2, M0 to M3, M1-1, M2-1 to M2-3, and M3-1 to M3-7, and the other coupling portions of the switches S2 to S6, S4-1, S5-1 to S5-3, and S6-1 to S6-7 are commonly coupled, as shown in FIG. 11. The coupling configuration is otherwise the same as in FIG. 9.

Here, the switching of the frequency performed by the commonly practiced switching of the constant current value using the current mirror ratio cannot be performed without being affected by device manufacturing variations because different devices are used for the individual frequency adjustment control signals SELI. As a result, frequency accuracy may be varied depending on the frequency adjustment control signals SELI.

Examples of a means for reducing the influence of the variations include an increase in transistor size, the application of an over-drive voltage (Vgs-Vth) to a level where the influence of a threshold voltage does not affect the frequency accuracy, and the like.

However, when the transistor size is increased, an area reduction cannot be achieved and, when the over-drive voltage is applied, a voltage reduction (power consumption reduction) cannot be achieved, each due to a tradeoff relationship therebetween.

$$Id = \frac{\mu \cdot C_{ox}}{2} \cdot \frac{W}{L}(Vgs - Vth)^2 \qquad (4)$$

Examples of a technique for solving the problem include the switching of the frequency using the electrostatic capacitive elements provided in the frequency-voltage conversion circuit 13.

In the switching of the frequency using the electrostatic capacitive elements, variations in the threshold voltages of the transistors as observed in the switching of the current using the current mirror ratio and the like do not occur, and pair accuracy between elements is relatively high. This allows easy design and, by selecting an electrostatic capacitive element with small variations such as a polysilicon capacitor, it is possible to prevent frequency accuracy from differing from one frequency adjustment control signal SELI to another. Here, a specific configuration of the clock oscillation circuit 2 of FIG. 1 is shown in FIG. 45.

However, to implement the switching of the electrostatic capacitive elements, it is necessary to add a circuit to the node for the voltage VSIG of the frequency-voltage conversion circuit which is extremely sensitive to frequency accuracy. Accordingly, a circuit configuration which minimizes the parasitic capacitance Cp2 included in the expression (2) is required.

FIG. 12 is an illustrative view showing an example of the frequency-voltage conversion circuit 13 having the function of switching the frequency using the electrostatic capacitive elements.

In this case, as shown in the drawing, the frequency-voltage conversion circuit 13 includes a switch portion including the switches SW1 and SW2, electrostatic capacitive elements C and C10 to C13, and switches CSW0 to CSW3 included in a capacitor selector portion. Here, the electrostatic capacitive elements C10 to C13 have capacitance values successively weighted with 2.

To one coupling portion of the switch SW1, an output terminal of the current output circuit 11 is coupled. To the other coupling portion of the switch SW1, respective one coupling portions of the switch SW2, the electrostatic capacitive element C, and the switches CSW0 to CSW3 are each coupled.

To the other coupling portions of the switches CSW0 to CSW3, one coupling portions of the electrostatic capacitive elements C10 to C13 are respectively coupled. To each of the other coupling portions of the switch SW2 and the electrostatic capacitive elements C and C10 to C13, the reference potential VSS is coupled.

To the control terminal of the switch SW1, the control signal ZCHR is coupled to be inputted thereto. To the control terminal of the switch SW2, the control signal DISC is coupled to be inputted thereto. To the control terminals of the switches CSW0 to CSW3, 4-bit frequency adjustment control signals SELC0 to SELC3 are respectively coupled to be inputted thereto.

The switch portion including the switches SW1 and SW2 performs charging and discharging of the capacitors using the current Iconst supplied from the current output circuit 11. The control signal ZCHR outputted from the control circuit 12 is a signal for charging, and the control signal DISC outputted from the control circuit 12 is a signal for discharging.

FIG. 13 is an illustrative view showing another example of the frequency-voltage conversion circuit 13 having the function of switching the frequency using the electrostatic capacitive elements.

In this case, as shown in the drawing, the frequency-voltage conversion circuit 13 has a configuration obtained by adding electrostatic capacitive elements C11-1, C12-1 to C12-3, and C13-1 to C13-7 and switches CSW1-1, CSW2-1 to CSW2-3, and CSW3-1 to CSW3-7 to the configuration of FIG. 12 including the switch portion including the switches SW1 and SW2, the electrostatic capacitive elements C and C10-C13, and the switches CSW0 to CSW3. Here, the electrostatic capacitive elements C10 to C13, C11-1, C12-1 to C12-3, and C13-1 to C13-7 have equal capacitance values.

One coupling portions of the switches CSW1-1, CSW2-1 to CSW2-3, and CSW3-1 to CSW3-7 are each coupled to the coupling portion between the switches SW1 and SW2. To the other coupling portions of the switches CSW1-1, CSW2-1 to CSW2-3, and CSW3-1 to CSW3-7, one coupling portions of the electrostatic capacitive elements C11-1, C12-1 to C12-3, and C13-1 to C13-7 are respectively coupled. To each of the other coupling portions of the electrostatic capacitive elements C11-1, C12-1 to C12-3, and C13-1 to C13-7, the reference potential VSS is coupled.

To the control terminal of the switch CSW1-1, the frequency adjustment control signal SELC1 is coupled to be inputted thereto. To each of the control terminals of the switches CSW2-1 to CSW2-3, the frequency adjustment control signal SELC2 is coupled to be inputted thereto.

To each of the control terminals of the switches CSW3-1 to CSW3-7, the frequency adjustment control signal SELC3 is coupled to be inputted thereto. The coupling configuration is otherwise the same as in FIG. 12. At this time, if the capacitance ratio between the individual capacitors is weighted with 2, control convenience is obtained, but the capacitance ratio need not necessarily be weighted with 2. The capacitance values may also be the same, or weighted appropriately if necessary.

FIG. 14 is a timing chart showing an example of the operation of the frequency-voltage conversion circuit 13 of FIG. 12.

The control signal ZCHR is generated in the control circuit 12 by halving the frequency of the clock signal CKOUT, and the width L thereof is equal to the frequency of the clock signal CKOUT. The control signal DISC causes the voltage VSIG to be equal to the reference potential VSS with a timing which does not affect a charge time so as to discharge charges from the electrostatic capacitive elements C and C10 to C13.

Note that, in FIG. 14, an exemplary case is shown in which control is performed once in each four cycles of the clock signal CKOUT. However, it is also possible to perform control once in each two cycles of the clock signal CKOUT. Even when control is performed at intervals of four or more cycles of the clock signal CKOUT, the operation of the frequency-voltage conversion circuit 13 is not affected thereby.

The clock oscillation circuit 2 performs negative feedback control such that, as shown in an expression (5), the output voltage VSIG is equal to the reference voltage VREFC in the frequency-voltage conversion circuit 13. To achieve high frequency accuracy, it is necessary that there is no power-supply/temperature dependence in a charging operation, and no non-linear component is produced.

$$Q = C \cdot VREFC \qquad (5)$$
$$Iconst \cdot Tout = C \cdot VREFC$$
$$VREFC = \frac{Iconst \cdot Tout}{C} = VSIG$$

In the circuit configuration shown in FIGS. 12 and 13, the switches CSW0 to CSW3 are provided closer to the positive electrodes (hereinafter electrodes each having a higher voltage level after charging will be referred to as the positive electrodes) of the electrostatic capacitive elements to control the electrostatic capacitive elements C10 to C13.

The electrostatic capacitive elements C10 to C13 have different absolute capacitance values (FIG. 12) or include unit capacitors which differ in the number of couplings therebetween (FIG. 13), and are provided so as to cover the frequency range intended by the designer. If consideration is given to variations, weighting with the number of the unit capacitors may be performed appropriately. If consideration is given to control convenience, weighting with 2 may be performed appropriately.

A switch CSW for selecting the electrostatic capacitive element is formed of, e.g., an N-channel MOS transistor as shown in FIG. 15, or formed of an N-channel MOS transistor and a P-channel MOS transistor which are coupled in parallel, as shown in FIG. 16.

In addition, the level at which the reference voltage VREFC is set is limited, and accordingly the reference voltage VREFC cannot be set at a high level. As a result, a sufficient bias cannot be applied to the transistor serving as the switch, a source voltage changes with the charging operation to increase the ON resistance, and non-linearity due to the ON resistance and the capacitance occurs in the expression (5) so that the advantage of applying the P-channel MOS transistor to the switch is low.

In the case of forming the switch of the N-channel MOS transistor also, in the same manner as in the case of forming the switch of the P-channel MOS transistor, the source voltage rises with charging, and therefore a constant ON resistance cannot be provided in a charging period so that non-linear components occur in the rising capacitor voltage, as shown in FIG. 14.

Therefore, under the limited condition that the reference voltage VREFC is set at a low voltage level free from the influence of the ON resistance of the switch formed of the N-channel MOS transistor, the switch formed of the N-channel MOS transistor allows the frequency to be switched using the capacitors.

Moreover, since the parasitic capacitance Cp2 of the switch formed of the N-channel MOS transistor occurs in the output voltage VSIG, in the circuit configuration of FIG. 12, it is preferred to provide a large capacitance so as not be affected by the parasitic capacitance Cp2.

FIG. 17 is an illustrative view showing an example of the frequency-voltage conversion circuit 13 in which the switches CSW0 to CSW3 formed of N-channel MOS transistors are provided closer to the negative electrodes (hereinafter electrodes each having a lower voltage level after charging will be referred to as the negative electrodes) of the electrostatic capacitive elements.

FIG. 18 is an illustrative view showing an example of the frequency-voltage conversion circuit 13 in which the switches CSW0 to CSW3, CSW1-1, CSW2-1 to CSW2-3, and CSW3-1 to CSW3-7 formed of N-channel MOS transistors are provided closer to the negative electrodes of the electrostatic capacitive elements.

FIG. 19 is a timing chart showing an example of an operational waveform at the node Vx in the frequency-voltage conversion circuit 13 of FIG. 17.

As shown in FIG. 17, by providing the switches CSW0 to CSW3 closer to the negative electrodes of the electrostatic capacitive elements C and C1 to C4, it is possible to provide a constant ON resistance during the charging period (constant gate-source voltage), and improve the non-linearity of the charging operation.

However, by providing the switches CSW0 to CSW3 closer to the negative electrodes of the electrostatic capacitive elements C and C1 to C4, the node Vx shown in FIG. 17 becomes uncertain during a non-selection period, and a potential at the node Vx rises due to a leakage current via the switches CSW0 to CSW3 to affect frequency accuracy, as shown in FIG. 19.

Here, the description has been given to the circuit configuration of FIG. 17 but, even in the circuit configuration of FIG. 18, the node Vx similarly becomes uncertain, and the potential at the node Vx rises due to a leakage current via the switches CSW0 to CSW4-7 to affect frequency accuracy.

FIG. 20 is an illustrative view showing an example of the frequency-voltage conversion circuit 13 having the function of resetting the node Vx that becomes uncertain to the level of the reference potential VSS.

In this case, as shown in the drawing, the frequency-voltage conversion circuit 13 has a configuration obtained by newly adding a reset portion including NAND circuits NAND1 to NAND4 and inverters Iv1 to Iv4 to the circuit configuration of FIG. 17.

To the input portions of the inverters Iv1 to Iv4, the frequency adjustment control signals SELC0 to SELC3 are respectively coupled to be inputted thereto. To the output portions of the inverters Iv1 to Iv4, one input portions of the NAND circuits NAND1 to NAND4 are respectively coupled. To each of the other input portions of the NAND circuits NAND1 to NAND4, a reset signal RST outputted from the control circuit 12 is coupled to be inputted thereto.

To the output portions of the NAND circuits NAND1 to NAND4, the control terminals of the switches CSW0 to CSW3 are respectively coupled. The coupling configuration is otherwise the same as in FIG. 17.

In the circuit of FIG. 20, a reset operation of coupling the node Vx that becomes uncertain between the non-selected electrostatic capacitive element and the switch to the reference potential VSS during one control cycle is performed such that the level at the node Vx is determined through voltage division between the selected capacitance and the parasitic capacitance of the uncertain node, as shown in the following expression (6).

$$Vx = \frac{Cx}{(Cx + Cpx)} \cdot VSIG \quad (6)$$

To introduce the resetting function, to the frequency-voltage conversion circuit 13, the reset signal RST is newly inputted.

FIG. 21 is a timing chart showing an example of the operation of the frequency-voltage conversion circuit 13 of FIG. 20.

As shown in the drawing, when a "L" level signal is inputted as the reset signal RST, the switches (CSW0 to CSW3) for the node Vx that is uncertain are turned ON so that the node Vx is reset to the voltage level of the reference potential Vss. The resetting operation needs to be performed with a timing which does not affect frequency accuracy, and may be performed appropriately during a capacitor discharging period.

As shown in FIG. 22, the resetting function shown in FIG. 20 is also applicable to the frequency-voltage conversion circuit shown in FIG. 18. In this case, the frequency-voltage conversion circuit 13 has a configuration obtained by newly adding NAND circuits NAND1 to NAND4, NAND2-1, NAND3-1 to NAND3-3, and NAND4-1 to NAND4-7, and inverters Iv1 to Iv4, Iv2-1, Iv3-1 to Iv3-3, and Iv4-1 to Iv4-7 to the circuit configuration of FIG. 18.

FIG. 23 is an illustrative view showing an example of the control circuit 12 for controlling the frequency-voltage conversion circuit 13 of FIG. 20. FIG. 24 is a timing chart of individual signals in the control circuit of FIG. 23.

As shown in FIG. 23, the control circuit 12 includes inverters Iv5 to Iv21, NAND circuits NAND5 to NAND8, and flip-flops FF1 to FF4. As shown in FIG. 23, the control circuit 12 uses only a rising edge of the clock signal CKOUT to accurately give output cycle information to the control signal ZCHR serving as a charge signal for determining the frequency accuracy of the clock signal CKOUT, and thereby implements a frequency-voltage converting operation. The reset signal RST is generated using the control signal DISC as a discharge signal.

FIG. 25 is an illustrative view showing another circuit configuration of the frequency-voltage conversion circuit 13 of FIG. 20. FIG. 26 is an illustrative view showing an example of coupling between the frequency-voltage conversion circuit 13 and the integration circuit 14.

In this case, the frequency-voltage conversion circuit 13 is configured by adding switches CSW10 to CSW13, electrostatic capacitive elements C14 to C17, and inverters Iv22 to Iv25 to the circuit shown in FIG. 20.

As shown in FIG. 26, the integration circuit 14 is coupled via the switch SW3 serving as a sampling switch controlled by the control signal SAMP, and forms a parallel switched capacitor integration circuit.

As shown in FIG. 27, the switch SW3 includes an inverter Iv24, electrostatic capacitive elements C18 and C19, and an N-channel MOS transistor TSW1.

Accordingly, the voltage VSIG outputted from the frequency-voltage conversion circuit 13 needs to be held till the node thereof is coupled to the integration circuit 14 after charging is completed.

In the circuit configuration shown in FIG. 20 described above, the voltage shown by the expression (6) is applied between the drain and source of each of the non-selected transistors (CSW0 to CSW3) during a holding period so that an extremely small sub-threshold leakage flows to cause slight temperature dependence in output frequency.

By contrast, in the circuit configuration of FIG. 25, measures for inhibiting the leakage current are taken by coupling N-channel MOS transistors each forming a selection switch in series to provide a two-stage configuration. In addition, the coupling portion between the series-coupled MOS transistors is coupled to the output of the inverter via a MOS capacitor so that the MOS transistors are at the Hi level during a non-selection period. In this manner, the terminal potentials of the MOS transistors can be controlled so as to inhibit the leakage current.

FIG. 28 is an illustrative view showing another circuit configuration of the frequency-voltage conversion circuit 13 of FIG. 22.

The frequency-voltage conversion circuit 13 of FIG. 28 is configured by adding, to the circuit configuration of FIG. 22, inverters Iv23-1, Iv24-1 to Iv24-3, Iv25-1 to Iv25-7, Iv22, Iv23, Iv23-1, Iv24, Iv24-1, Iv24-3, and Iv25, switches CSW10, CSW11, CSW11-1, CSW12, CSW12-1 to CSW12-3, CSW13, and CSW13-1 to CSW13-7, electrostatic capacitive elements C14, C15, C15-1, C16, C16-1 to C16-3, C17, and C17-1 to C17-7.

In this case also, in the same manner as in FIG. 25, the N-channel MOS transistors each forming the selection switch are coupled in series to provide a two-stage configuration, and inhibit the leakage current.

As shown in the expression (2), the parasitic capacitance Cpx in the voltage VSIG outputted from the frequency-voltage conversion circuit 13 gives influence to frequency accuracy.

For example, as shown in FIG. 20, the parasitic capacitance Cpx between the non-selected electrostatic capacitive elements (C1 to C4) and the switches CSW seems as a parallel capacitance with a switching capacitance Cx to the voltage VSIG.

$$Cp2 = Cpx // Cx \quad (7)$$

Therefore, it is necessary to minimize the parasitic capacitance Cpx. FIG. 29 is an illustrative view showing an example of a layout which minimizes the parasitic capacitance Cpx in the frequency-voltage conversion circuit 13 of FIG. 28.

As shown in the drawing, the electrostatic capacitive elements C1 to C4, C2-1, C3-1 to C3-3, and C4-1 to C4-7 and a control portion (circuit configuration surrounded by the dotted rectangle of FIG. 28) CNT are coupled with shortest lines H1 to H4 so that the parasitic capacitance is suppressed. Since the reset signal changes on a per function basis, the control portion CNT is placed over or under each of the electrostatic capacitive elements for the avoidance of crosstalk with the electrostatic capacitive element.

As a result, according to Embodiment 1, the number of the electrostatic capacitive elements coupled to the capacitive node 12 in the frequency-voltage conversion circuit 13 can be changed. This allows the clock oscillation circuit 2 to generate the clock signal with a high-accuracy targeted frequency.

Embodiment 2

In Embodiment 1 described above, the description has been given to the technique which switches the targeted frequency of the clock signal by changing the values of the electrostatic capacitive elements or the number of the electrostatic capacitive elements, and thereby adjusts the frequency of the clock signal to the targeted frequency with high accuracy. In Embodiment 2 of the present invention, a description will be given of a technique which adjusts the targeted frequency of the clock by a current switching method.

In the method of switching the frequency by the conventional current switching method, a clock signal with a high-accuracy frequency cannot be obtained. However, by adding an improvement to the current switching method, it is also possible to obtain a clock signal with a frequency higher in accuracy than the conventionally obtained clock signal.

In Embodiment 2, a description will be given of the current switching method (which changes the sizes or number of the transistors).

Figure 30:
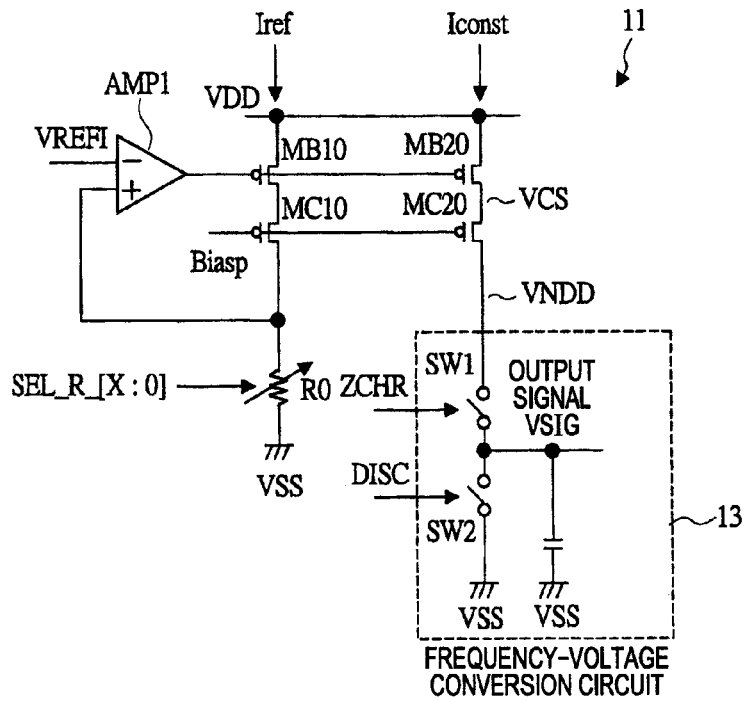
FIG. 30 is an illustrative view showing a detailed circuit configuration of the current generation circuit according to Embodiment 2 of the present invention.
Figure 31:
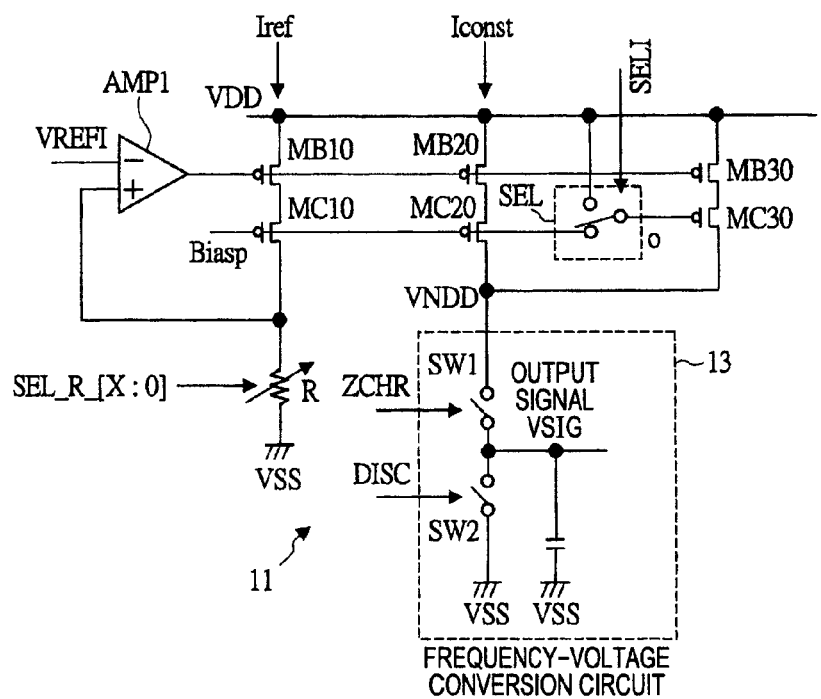
FIG. 31 is an illustrative view showing an example when the current generation circuit of FIG. 30 is provided with a current switching function.
Figure 32:
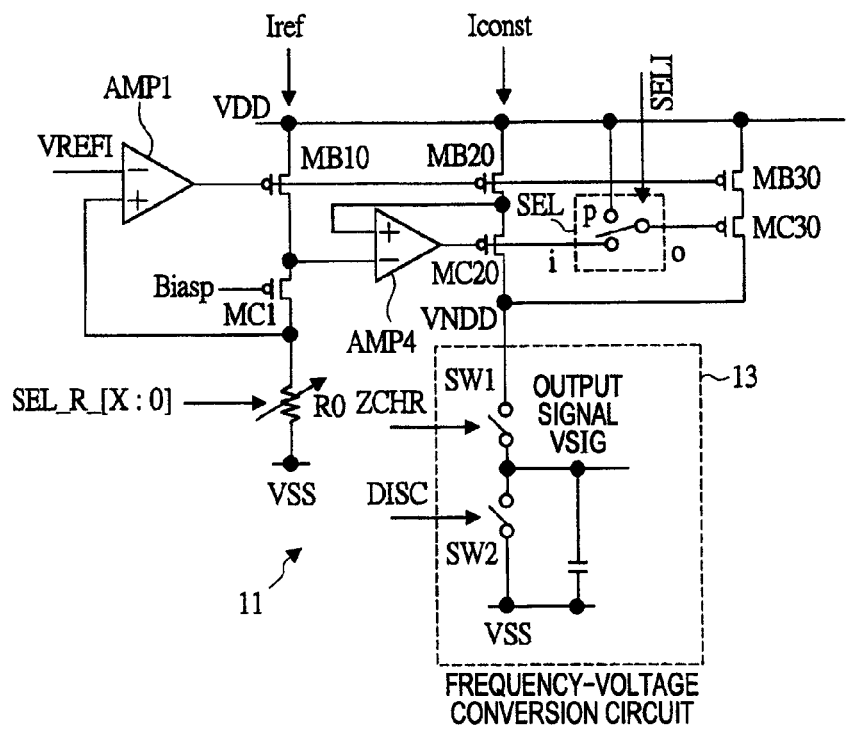
FIG. 32 is an illustrative view showing another example of the current generation circuit of FIG. 31.
Figure 33:
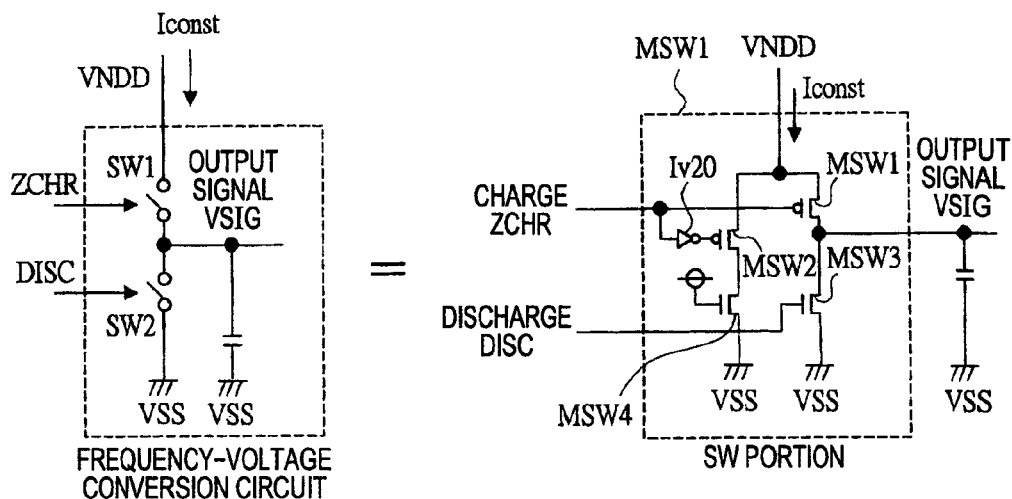
FIG. 33 is an illustrative view showing a detailed configuration in a switch portion of the frequency-voltage conversion circuit of FIG. 2.
Figure 34:
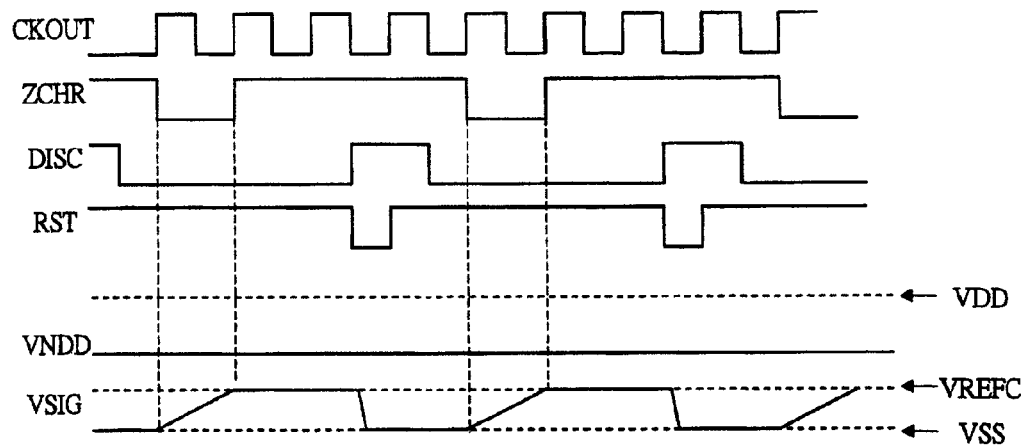
FIG. 34 is a timing chart for a frequency-voltage converting operation in the frequency-voltage conversion circuit coupled to the current generation circuit of FIG. 30.
Figure 35:
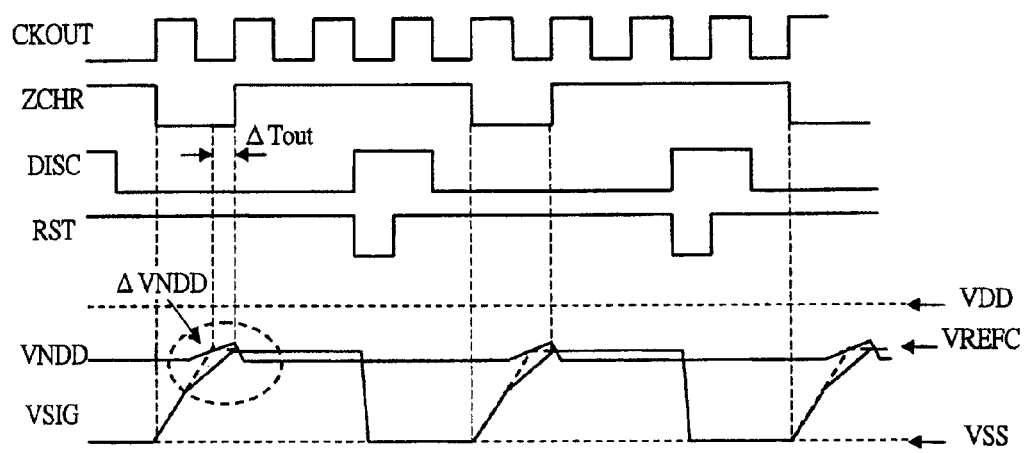
FIG. 35 is a timing chart for the frequency-voltage converting operation in the frequency-voltage conversion circuit when a voltage VNDD varies.
Figure 36:
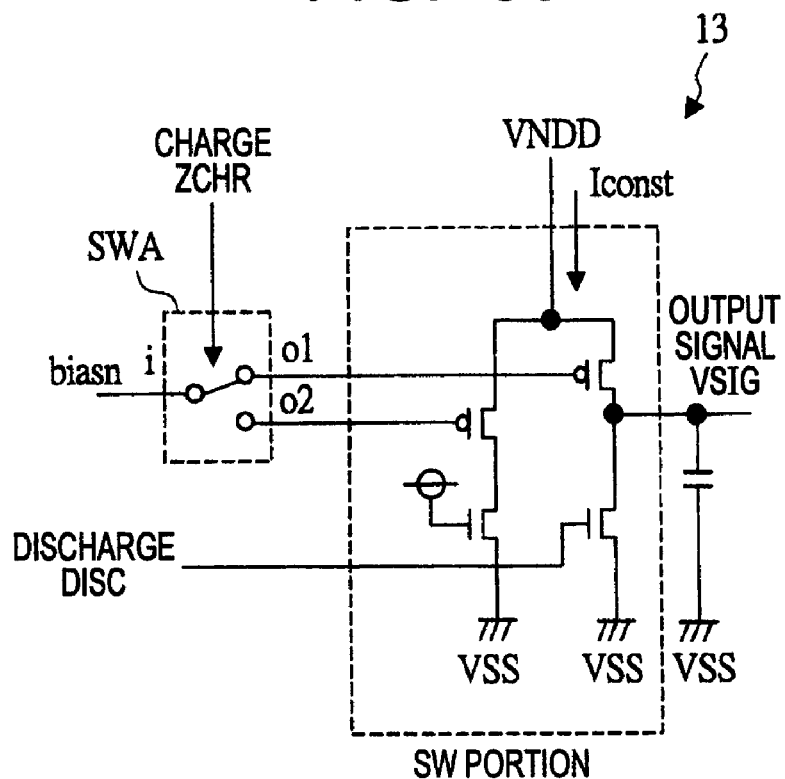
FIG. 36 is an illustrative view showing another example of the frequency-voltage conversion circuit of FIG. 33.
Figure 37:
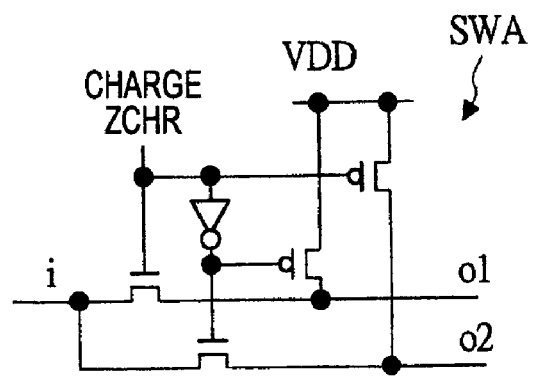
FIG. 37 is an illustrative view showing an example of an analog switch used in the frequency-voltage conversion circuit of FIG. 36.

FIG. 30 is an illustrative view showing a detailed circuit configuration of the current generation circuit according to Embodiment 2. FIG. 31 is an illustrative view showing an example when the current generation circuit of FIG. 30 is provided with a current switching function. FIG. 32 is an illustrative view showing another example of the current generation circuit of FIG. 31. FIG. 33 is an illustrative view showing a detailed configuration in a switch portion of the frequency-voltage conversion circuit of FIG. 2. FIG. 34 is a timing chart for a frequency-voltage converting operation in the frequency-voltage conversion circuit coupled to the current generation circuit of FIG. 30. FIG. 35 is a timing chart for the frequency-voltage converting operation in the frequency-voltage conversion circuit when a voltage VNDD varies. FIG. 36 is an illustrative view showing another example of the frequency-voltage conversion circuit of FIG. 33. FIG. 37 is an illustrative view showing an example of an analog switch used in the frequency-voltage conversion circuit of FIG. 36.

In Embodiment 2, FIG. 30 is an illustrative view showing the detailed circuit configuration of the current output circuit 11.

As shown in the drawing, the current output circuit 11 includes the operational amplifier AMP1, P-channel MOS transistors MB10, MB20, MC10, MC20, and a resistor R0.

To the negative (−) input terminal of the operational amplifier AMP1, the reference voltage VREFI is coupled to be inputted thereto. To the output portion of the operational amplifier AMP1, the gates of the transistors MB10 and MB20 are each coupled.

To each of one coupling portions of the transistors MB10 and MB20, the power supply voltage VDD is coupled to be supplied thereto. To the other coupling portion of the transistor MB10, one coupling portion of the transistor MC10 is coupled. To the other coupling portion of the transistor MC10, the positive (+) input terminal of the operational amplifier AMP1 and one coupling portion of the resistor R0 are each coupled. To the other coupling portion of the resistor R0, the reference potential VSS is coupled.

To the other coupling portion of the transistor MB20, one coupling portion of the transistor MC20 is coupled. To each of the gates of the transistors MC10 and MC20, a bias voltage Biasp is supplied. To the other coupling portion of the transistor MC20, the frequency-voltage conversion circuit 13 is coupled.

The current output circuit 11 follows the reference voltage VREFI of the reference voltage generation circuit 10 to apply the reference voltage VREFI to the resistor R, and generate the current Iref=VREFI/R.

At this time, the reference voltage VREFI is adjusted by the current output circuit 11 to have a temperature coefficient equivalent to the primary temperature coefficient of the resistor R0, and provide a current Iref without temperature dependence.

The current Iref is current-mirrored by the transistors MB10 and MB20, and outputted to the frequency-voltage conversion circuit 13. In this case, by using the transistors MC10 and MC20 coupled in cascode, respective drain-source voltages Vds of the transistors MC10 and MC20 are set equal to each other, and the voltage dependence of the current Iconst is eliminated.

FIG. 31 is an illustrative view showing an example when the current output circuit 11 of FIG. 30 is provided with the current switching function. In this case, the circuit configuration of FIG. 30 is newly provided with a selector SEL which operates with the control signal SELI from the control circuit 12 and transistors MB30 and MC30, resulting in an embodiment using cascode coupling.

To one coupling portion of the transistor MB30, the power supply voltage VDD is supplied. To the other coupling portion of the transistor MB30, one coupling portion of the transistor MC30 is coupled.

To the gate of the transistor MB30, the output portion of the operational amplifier AMP1 is coupled. To the other coupling portion of the transistor MC30, the other coupling portion of the transistor MC20 is coupled.

The selector SEL selects either the power supply voltage VDD or the bias voltage Biasp based on the control signal SELI, and outputs a signal to be inputted to the gate of the transistor MC30 such that the outputted signal has the selected voltage.

FIG. 32 shows a configuration obtained by newly adding an operational amplifier AMP4 to the circuit configuration of FIG. 31, which is an embodiment using regulated cascode coupling. To the output of the operational amplifier AMP4, the gate of the transistor MC20 is coupled. To the negative (−) input terminal of the operational amplifier AMP4, the coupling portion between the transistors MB10 and MC10 is coupled. To the positive (+) input terminal of the operational amplifier AMP4, the coupling portion between the transistors MB20 and MC20 is coupled.

In the current output circuit 11 of each of FIGS. 31 and 32, the transistor MC30 coupled in cascode is used as the transistor the ON/OFF state of which is controlled by the selector SEL to achieve the effect of preventing the degradation of current accuracy caused by switching. This will be easily understood if consideration is given to the case where the selector SEL is inserted between the gate of the transistor MB30 and the operational amplifier AMP1 without providing cascode coupling. In this case, the drain voltage of the transistor MB10 is a voltage VFBCK, and the drain voltage of each of the transistors MB20 and MB30 is the voltage VNDD. Since the respective drain-source voltages of the transistors MB10, MB20, and MB30 are different, there is the possibility that a current ratio between the transistors MB10 and MB20 forming the current mirror circuit and the transistor MB30 may be unproportional to the transistor size. On the other hand, in the case where the transistor MC30 coupled in cascode is turned ON/OFF with the selector SEL, the drain-source voltages become equal due to the cascode coupling to achieve the effect of allowing the current switching function to be implemented while maintaining current accuracy.

By thus providing the current output circuit 11 with a configuration as described above, it is possible to generate the constant current Iconst without temperature dependence.

Next, it presents a technical challenge to perform how accurately the frequency-voltage converting operation using the constant current Iconst from the current output signal 11 and the control signal ZCHR serving as the charge signal is performed. It is to be noted that the output of the current output circuit 11 is formed of a P-channel MOS device.

In general, when it is needed to implement high analog accuracy against variations in power supply voltage as needed in an oscillator embedded in a semiconductor device, operating a circuit using the level of the reference potential VSS as a reference is fundamental.

However, the substrate of a PMOS device of a current generation circuit is supplied with the power supply voltage VDD, and a diffusion capacitance Cp1 exists between the drain/source and the power supply voltage VDD. As a result, an amount of charges Cp1·ΔVNDD with which the diffusion capacitance Cp1 is charged has dependence on the power supply voltage VDD.

Therefore, it is necessary to provide a frequency-voltage conversion circuit with a configuration in which, to improve frequency accuracy, the node to which the voltage VNDD is supplied is free from voltage variations irrespective of a power supply.

FIG. 33 shows an example of a reduction in variations in voltage VNDD, which is an illustrative view showing a detailed configuration in the switch portion of the frequency-voltage conversion circuit 13 shown in FIG. 2.

As shown in the drawing, the switch portion of the frequency-voltage conversion circuit 13 is comprised of transistors MSW1 and MSW2 forming the switch SW1, an inverter Iv20, and transistors MSW3 and MSW4 forming the switch SW2.

The operations of the transistors MSW1 and MSW2 are controlled by the control switch ZCHR to operate as current switches for switching the flow of the current Iconst. The transistors MSW1 and MSW2 are configured as the current switches in order to prevent variations in the voltage VNDD caused by the elimination of a path which allows the current Iconst to flow when the switch SW1 is in the OFF state. At this time, the sizes and device species of the transistors MSW1 and MSW2 are the same.

To prevent variations in the voltage VNDD, it is necessary to cause the transistor MSW1 to perform a saturated operation in the process of charging. From a condition for the saturated operation of the transistor MSW1, a design expression (expression (7)) related to the voltage level of the voltage VSIG, i.e., the level of the reference voltage VREFC can be derived.

$$V_{NDD} - Vthp\_msw1 < V_{NDD} - VSIG = Vov\_msw1$$

$$V_{NDD} - Vthp\_msw1 < V_{NDD} - VREFC$$

$$Vthp\_msw1 > VREFC \quad (7)$$

Here, Vthp_msw1 is the threshold voltage of the transistor MSW1, Vov_msw1 is a voltage obtained by subtracting Vthp_msw1 from the voltage VNDD, and it is the condition for the saturated operation of the transistor MSW1 that the drain-source voltage of the transistor MSW1 is higher than Vov_msw1. From the expression (7), it will be understood that, by setting the voltage VREFC lower than Vthp_msw1, it is consequently possible to ensure the potential difference between the potential of the voltage VSIG and the potential of the voltage VNDD, which satisfies the condition for the saturated operation of the transistor MSW1. Therefore, in Embodiment 2, it is important to set the voltage VREFC lower than the threshold voltage Vthp_msw1 of the transistor MSW1.

FIG. 34 is a timing chart of the frequency-voltage converting operation in the frequency-voltage conversion circuit 13. When the design expression (7) is satisfied, the transistor MSW1 operates in a saturation region, and the voltage VNDD can be held constant during the frequency-voltage converting operation.

On the other hand, FIG. 35 shows a waveform when the design expression (7) is not satisfied. As shown in the drawing, in the process of the charging operation caused by the control signal ZCHR, the transistor MSW1 shifts to an unsaturated operation and, with the rising of the voltage VSIG, the voltage level of the voltage NVDD varies. As a result, $\Delta Q = Cp1 \cdot \Delta VNDD$ varies in power-supply/temperature conditions to degrade frequency accuracy.

FIG. 36 is an illustrative view showing another example of the frequency-voltage conversion circuit 13 of FIG. 33.

In the circuit configuration of FIG. 33, to the gates of the transistors MSW1 and MSW2, CMOS levels which are 1 (Hi) and 0 (Lo) are applied. As long as the design expression (7) is satisfied, the gate voltages of the transistors MSW1 and MSW2 need not be CMOS signals. It may also be possible to apply, e.g., a bias signal biasn to the transistors MSW1 and MSW2 using an analog switch SWA as shown in FIG. 37.

As a result, in Embodiment 2, by configuring the current output circuit 11 such that the transistors the ON/OFF states of which are controlled by the selector SEL are coupled in cascode, it is possible to prevent the degradation of current accuracy by the switching (current switching) of the transistors. By generating the current Iconst having small temperature dependence, and supplying the current Iconst to the frequency-voltage conversion circuit 13, the clock oscillation circuit 2 can generate the clock signal with the high-accuracy targeted frequency.

Embodiment 3

Figure 38:
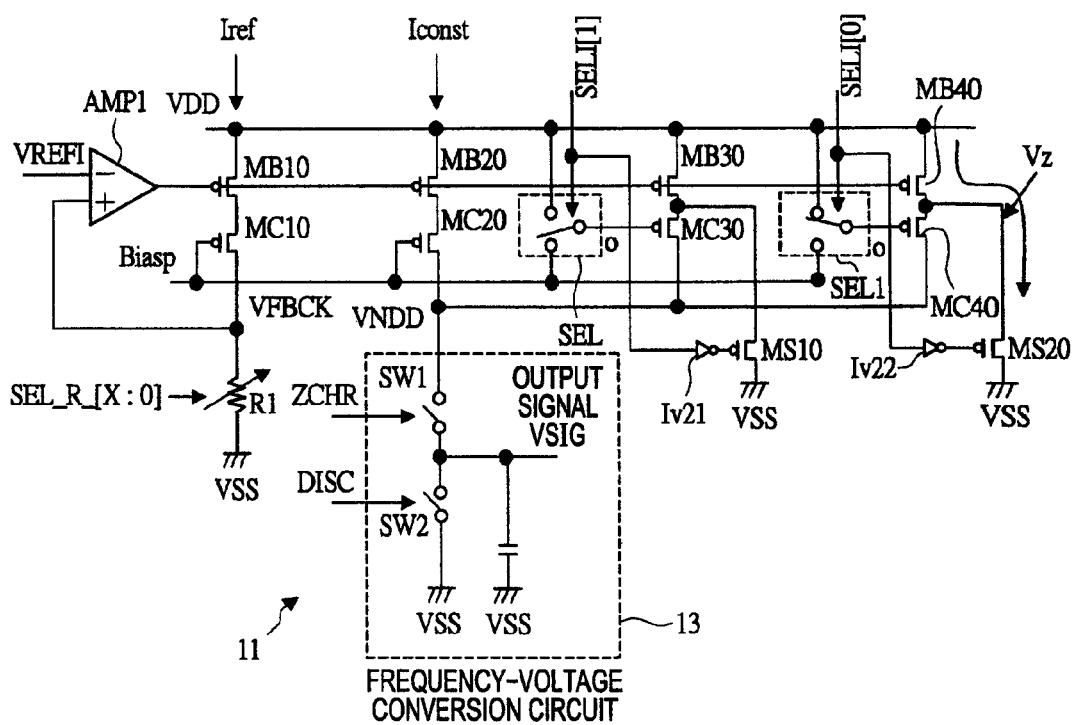
FIG. 38 is an illustrative view showing an example of the current generation circuit according to Embodiment 3 of the present invention.
Figure 39:
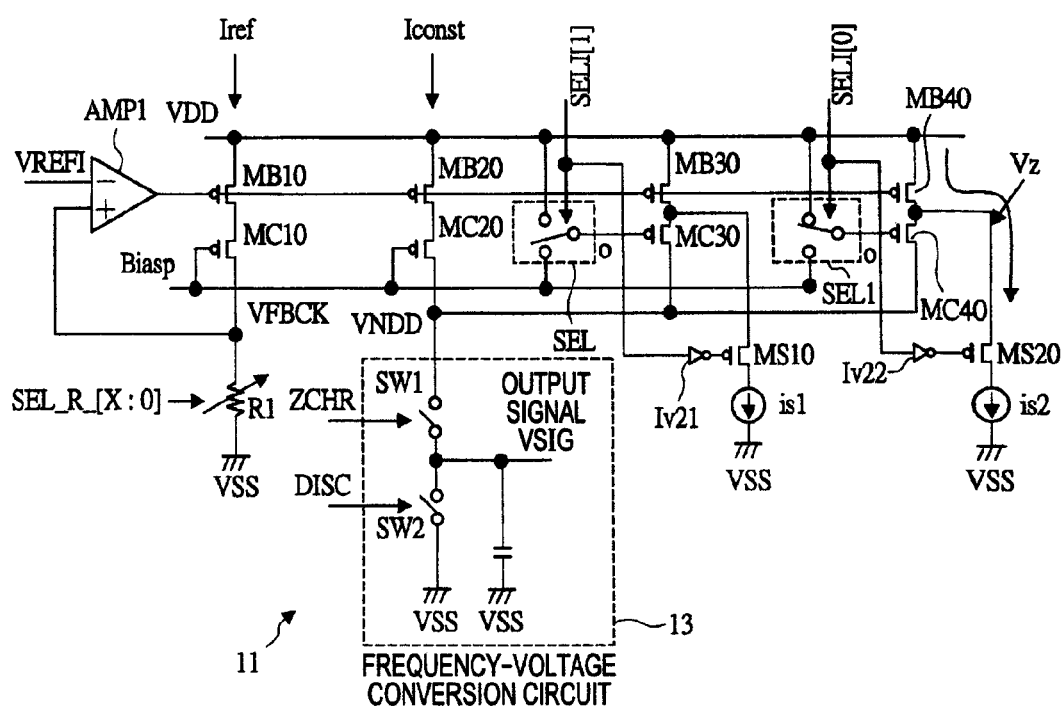
FIG. 39 is an illustrative view showing another example of the current generation circuit of FIG. 38.

FIG. 38 is an illustrative view showing an example of the current generation circuit according to Embodiment 3 of the present invention. FIG. 39 is an illustrative view showing another example of the current generation circuit of FIG. 38.

In Embodiment 3, FIG. 38 is an illustrative view showing an example of the current output circuit 11 having a 2-bit switching function, for which measures against a leakage current have been taken.

As shown in FIGS. 8, 9, 31, and 32, when the current output circuit 11 has the frequency switching function, the sub-threshold leakage current Ioff from an unselected current source shown in the expression (2) presents a problem to frequency accuracy. Since the leakage current has large power-supply/temperature dependence, it is necessary to design a device in a device size having a large gate length, and take essential measures against the leakage current for the circuit.

In this case, as shown in the drawing, the current output circuit 11 is configured by providing the circuit configuration of FIG. 31 with P-channel MOS transistors MB40, MC40, MS10, MS20, and inverters Iv21 and Iv22.

In this case, in the current source for switching the frequency, the transistor MS20 serving as a path for discarding the current during a non-selection period is prepared. As an enable signal for the path for discarding the current, an inversion signal of the control signal SELI outputted from the control circuit 12 is used.

By discarding the current to the reference potential VSS, the node Vz of FIG. 38 reaches the level of the reference potential VSS, and the transistor MC40 is brought into a reversely biased state. As a result, it is possible to inhibit a leakage current flowing into the frequency-voltage conversion circuit 13.

FIG. 39 is an illustrative view showing another example of the current output circuit 11 of FIG. 38.

In this case, the current output circuit 11 has a configuration obtained by providing the circuit configuration of FIG. 38 with current sources is1 and is2. By respectively providing the other coupling portions (sources) of the transistors MS10 and MS20 with the current sources is1 and is2, it is possible to control the value of the discarded current to the reference potential VSS.

As a result, according to Embodiment 3, it is possible to reduce the leakage current flowing into the frequency-voltage conversion circuit 13 using the transistor MS20 provided in the current output circuit 11. Therefore, the clock signal with the higher-accuracy targeted frequency can be generated.

Embodiment 4

Figure 40:
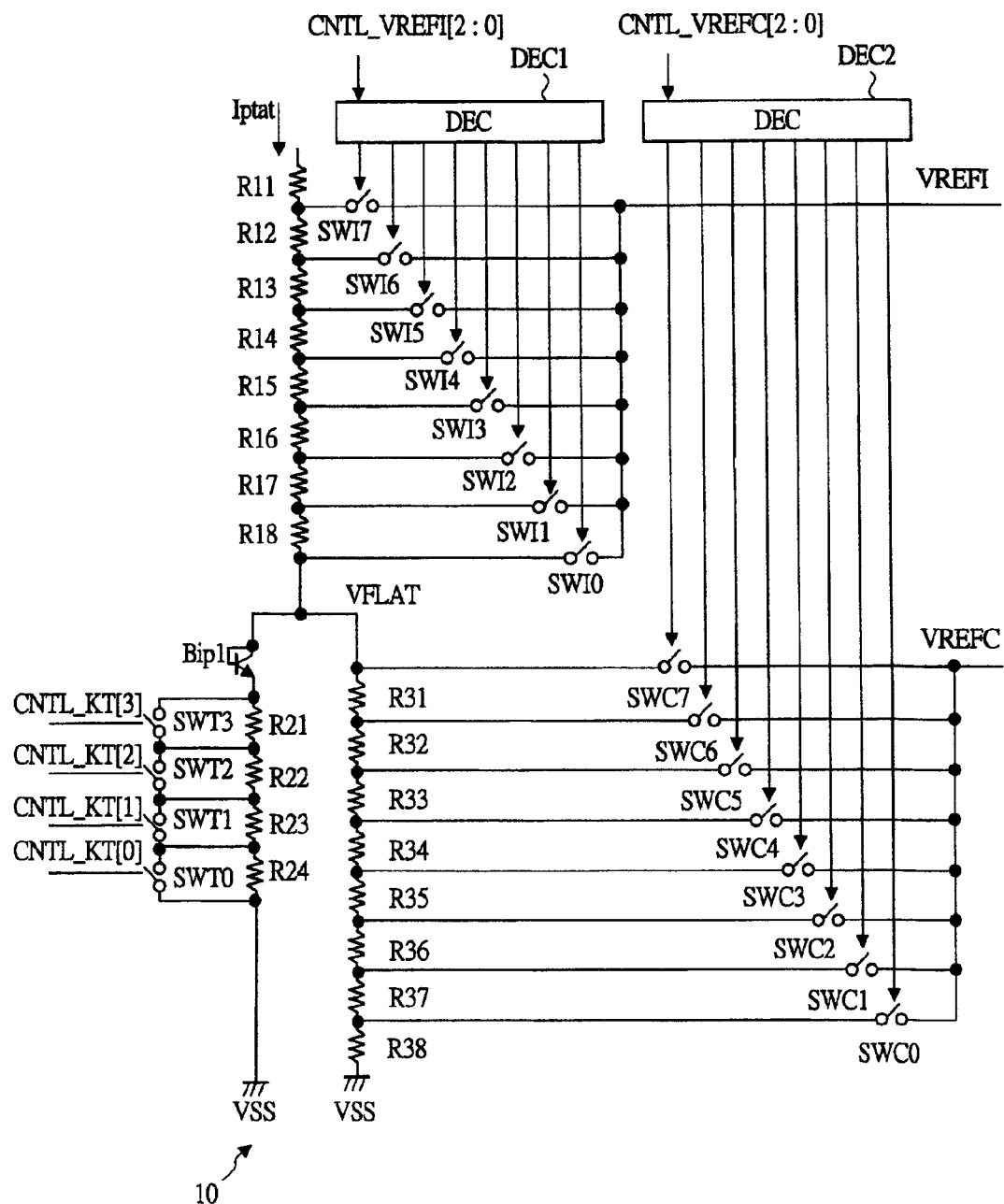
FIG. 40 is an illustrative view showing an example of the reference voltage generation circuit according to Embodiment 4 of the present invention.
Figure 41:
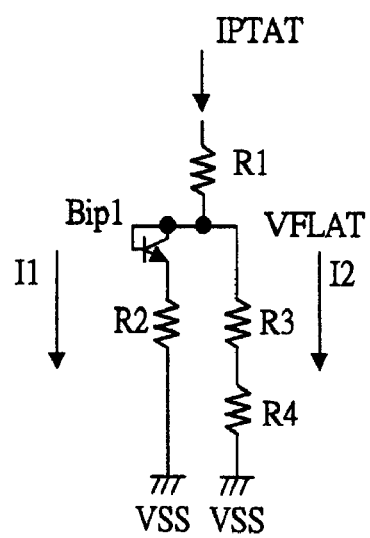
FIG. 41 is a simplified schematic view showing the reference voltage generation circuit of FIG. 40.
Figure 42:
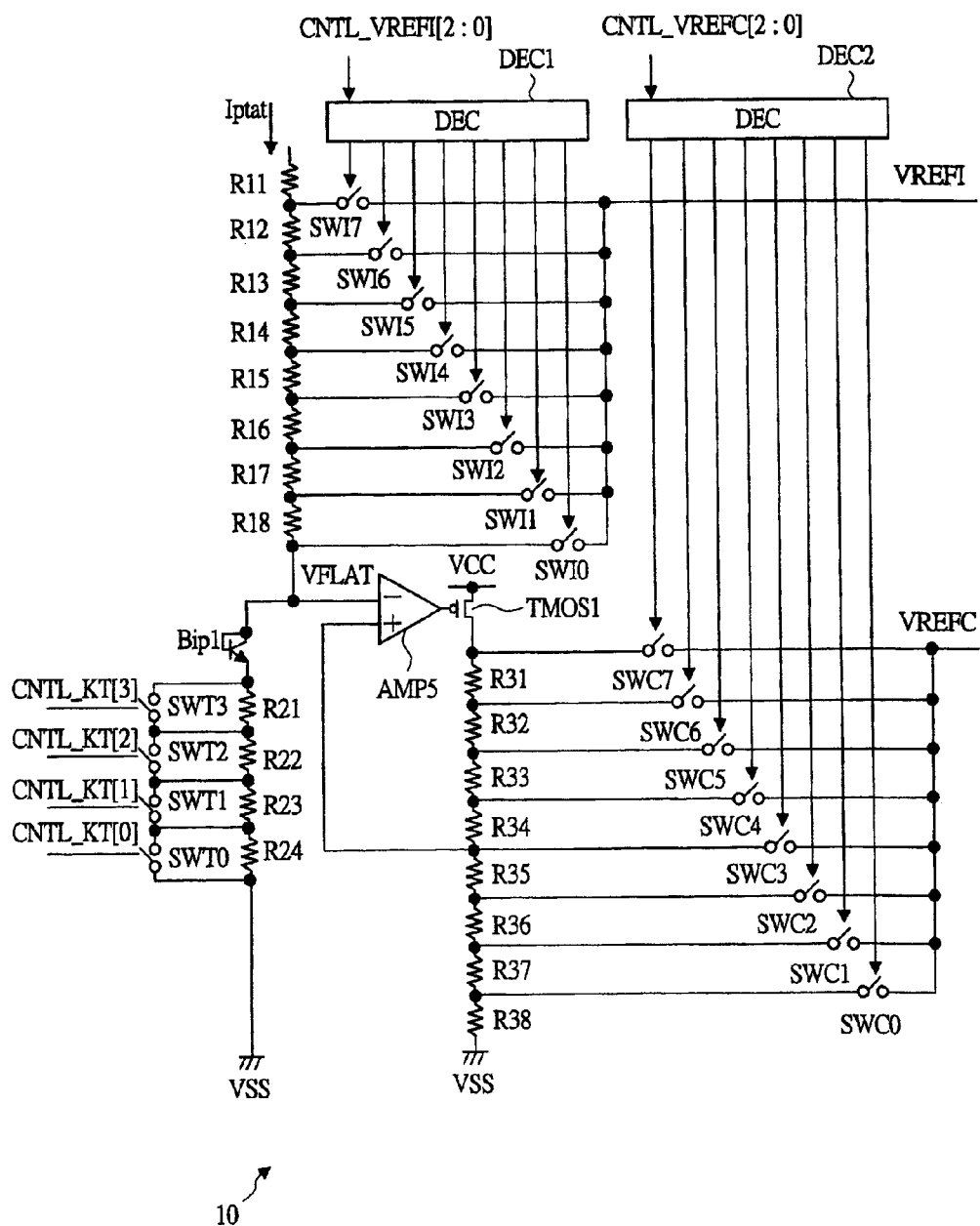
FIG. 42 is an illustrative view showing another example of the reference voltage generation circuit of FIG. 40.

FIG. 40 is an illustrative view showing an example of the reference voltage generation circuit according to Embodiment 4 of the present invention. FIG. 41 is a simplified schematic view of the reference voltage generation circuit of FIG. 40. FIG. 42 is an illustrative view showing another example of the reference voltage generation circuit of FIG. 40.

In Embodiment 4, FIG. 40 is an illustrative view showing an example of a detailed configuration of the reference voltage generation circuit 10 for generating the reference voltages VREFI and VREFC based on 3-bit temperature trimming signals CNTL_VREFI[2:0] and CNTL_VREFC[2:0].

The reference voltage generation circuit 10 includes resistors R11 to R18, resistors R21 to R24, resistors R31 to 38, switches SWT0 to SWT3, switches SWI0 to SWI7, switches SWC0 to SWC7, a transistor Bip1 formed of a bipolar element, and decoders DEC1 and DEC2.

The resistors R11 to R18 are coupled in series. Between the other coupling portion of the resistor R18 and the reference potential VSS, the resistors R31 to R38 coupled in series similarly to the transistor Bip1 and the resistors RR21 to R24 which are coupled in series are each coupled in parallel.

To each of the coupling portions between the transistor Bip1 and the resistor R21 and between the resistors R21 to R24, a current Iptat which is a PTAT (Proportional To Absolute Temperature) current generated by the reference voltage generation circuit 10 is coupled to be supplied thereto.

To the respective coupling portions between the resistors R11 to R18, one coupling portions of the switches SWI0 to SWI7 are coupled. The other coupling portions of the switches SWI0 to SWI7 are commonly coupled to serve as the output portion of the reference voltage VREFI.

To the respective coupling portions between the resistors R31 to R38, one coupling portions of the switches SWC0 to SWC7 are coupled. The other coupling portions of the switches SWC0 to SWC7 are commonly coupled to serve as the output portion of the reference voltage VREFC.

The decoder DEC1 decodes the temperature trimming signal VCNTL_VREFI, and turns ON any arbitrary one of the switches SWI0 to SWI7. The decoder DEC2 decodes the temperature trimming signal VCNTL_VREFC, and turns ON any arbitrary one of the switches SWC0 to SWC7.

Of the operation, a description will be given using the simplified schematic view of FIG. 41. A voltage $V_{FLAT}$ having no temperature dependence is shown as in the expression (8), and implemented by making adjustment using a control signal CNTL_KT so as to cancel out the temperature dependence of a base-emitter voltage Vbe of the transistor Bip1 with the temperature dependence of the product between the current Iptat and the resistor R2.

The reference voltage VREFC is implemented by subjecting the voltage $V_{FLAT}$ having no temperature dependence to resistive voltage division as shown in an expression (9), and the output level thereof is controlled using the temperature trimming signal CNTL_VREFC.

The output level and temperature characteristic of the reference voltage VREFI are adjusted using the temperature trimming signal VCNTL_VREFI so as to cancel out the temperature characteristic of the resistance of the constant current generation circuit with the product between the resistance R1 and the current Iptat, as shown in an expression (10).

$$I_{PTAT} = I_1 + I_2 \quad (8)$$
$$V_{FLAT} = (R_3 + R_4) \cdot I_2$$
$$V_{FLAT} = Vbe + R_2 \cdot I_1$$
$$I_1 = I_{PTAT} - I_2$$
$$V_{FLAT} = Vbe + R_2 \cdot (Iptat - I_2)$$
$$Vbe + R_2 \cdot (I_{PTAT} - I_2) = (R_3 + R_4) \cdot I_2$$

$$I_2 = \frac{Vbe + R_2 \cdot I_{PTAT}}{R_2 + R_3 + R_4} \quad (9)$$

$$V_{FLAT} = \left(\frac{R_3 + R_4}{R_2 + R_3 + R_4}\right) \cdot (Vbe + R_2 \cdot Iptat)$$

$$VREFC = \left(\frac{R_4}{R_2 + R_3 + R_4}\right) \cdot (Vbe + R_2 \cdot Iptat)$$

$$VREFI = V_{FLAT} + R_1 \cdot I_{PTAT} \quad (10)$$
$$VREFI = \left(\frac{R_3 + R_4}{R_2 + R_3 + R_4}\right) \cdot (Vbe + R_2 \cdot Iptat) + R_1 \cdot I_{PTAT}$$

The characteristic feature of the circuit shown in FIG. 40 is that the series-coupled resistors R21 to R24 for controlling the temperature characteristic are coupled to the emitter of the transistor Bip1 formed of the bipolar element. In a band gap reference circuit also, there is the same circuit configuration, and it is typical to couple series resistors to the collector of the transistor Bip1 formed of the bipolar element. This is because the temperature dependence of the output voltage of the band gap reference circuit needs to be controlled both positively and negatively.

However, because of coupling to the collector of the transistor Bip1, the ON resistance of a transistor used for a shunt switch increases due to the substrate bias effect thereof. In an oscillator embedded in the semiconductor device in which frequency variations need to be suppressed to a range of ±1%, the temperature dependence of the ON resistance cannot be ignored.

In the clock oscillation circuit 2, in the voltage $V_{FLAT}$ (FIG. 40), positive/negative control of the temperature dependence is unneeded. Accordingly, the resistors R21 to R24 are coupled to the emitter side of the transistor Bip1 to take measures against the substrate bias effect, and prevent the ON resistance from affecting frequency accuracy.

By the foregoing operation, the generation of the reference voltage VREFI having temperature dependence and the reference voltage VREFC having no temperature dependence is implemented with the same generation path.

FIG. 42 is an illustrative view showing another example of the reference voltage generation circuit 10 of FIG. 40.

The reference voltage generation circuit 10 is configured by newly adding an operational amplifier AMP5 and a P-channel MOS transistor TMOS1 to the circuit configuration of FIG. 40. In the circuit configuration shown in FIG. 40, the voltage $V_{FLAT}$ is divided and outputted, and therefore a voltage level of not less than the voltage $V_{FLAT}$ cannot be generated.

Accordingly, as shown in FIG. 42, the voltage $V_{FLAT}$ is coupled to the middle point between the series-coupled resistors R31 to R38 with a voltage follower circuit formed of the operational amplifier AMP5. This allows a voltage level of not less than the voltage $V_{FLAT}$ having no power-supply/temperature dependence to be generated.

In Embodiment 4, by coupling the resistors R21 to R24 to the emitter side of the transistor Bip1, it is possible to reduce the ON resistance of the transistor Bip1, and therefore reduce frequency variations in the clock oscillation circuit 2.

While the invention achieved by the present inventors has been specifically described heretofore based on the embodiments of the present invention, it will be appreciated that the present invention is not limited to the embodiments described above, and various changes and modifications can be made in the invention within the scope not departing from the gist thereof. It is also possible to implement the plurality of embodiments shown in the present invention in mutually combined relation.

Figure 43:
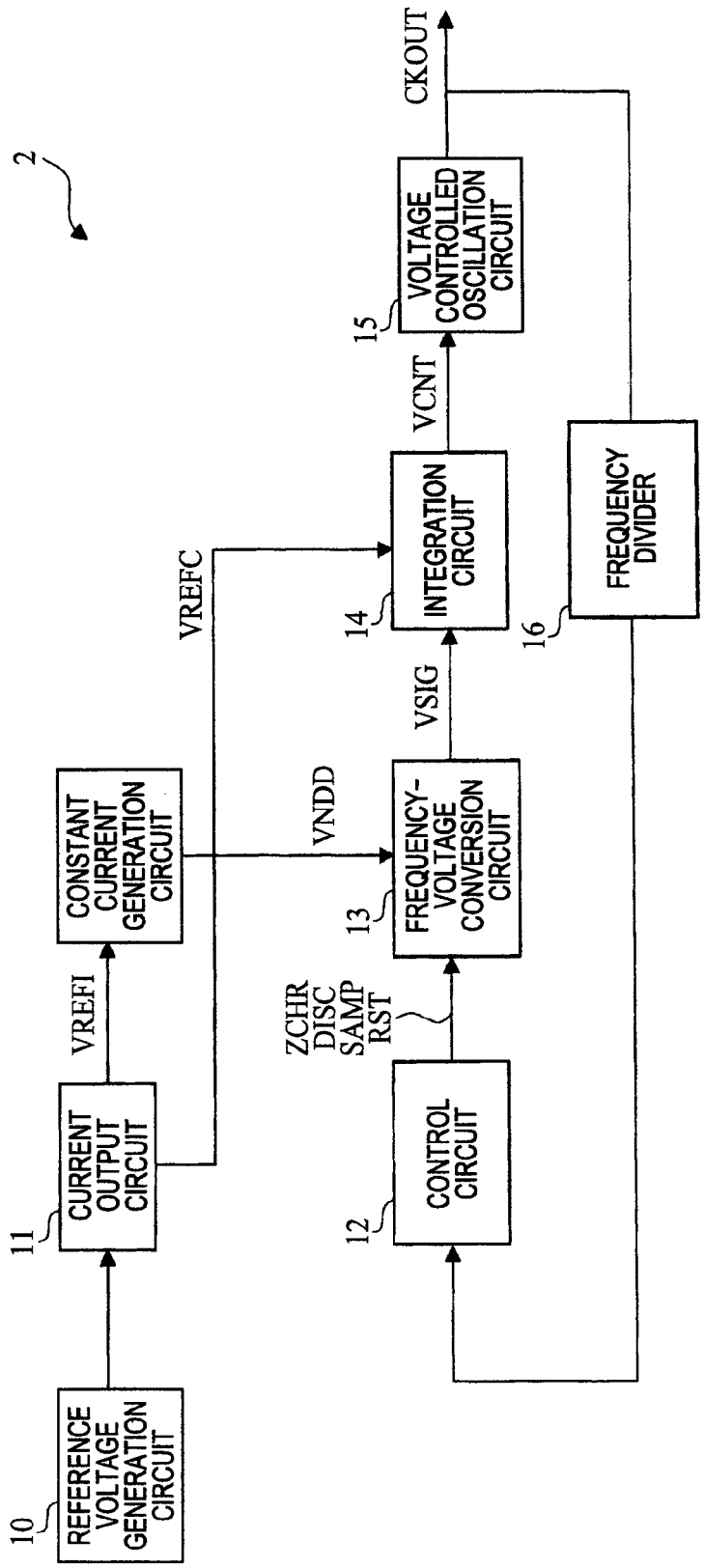
FIG. 43 is a block diagram showing an example of a configuration in the oscillator portion according to another embodiment of the present invention.
Figure 44:
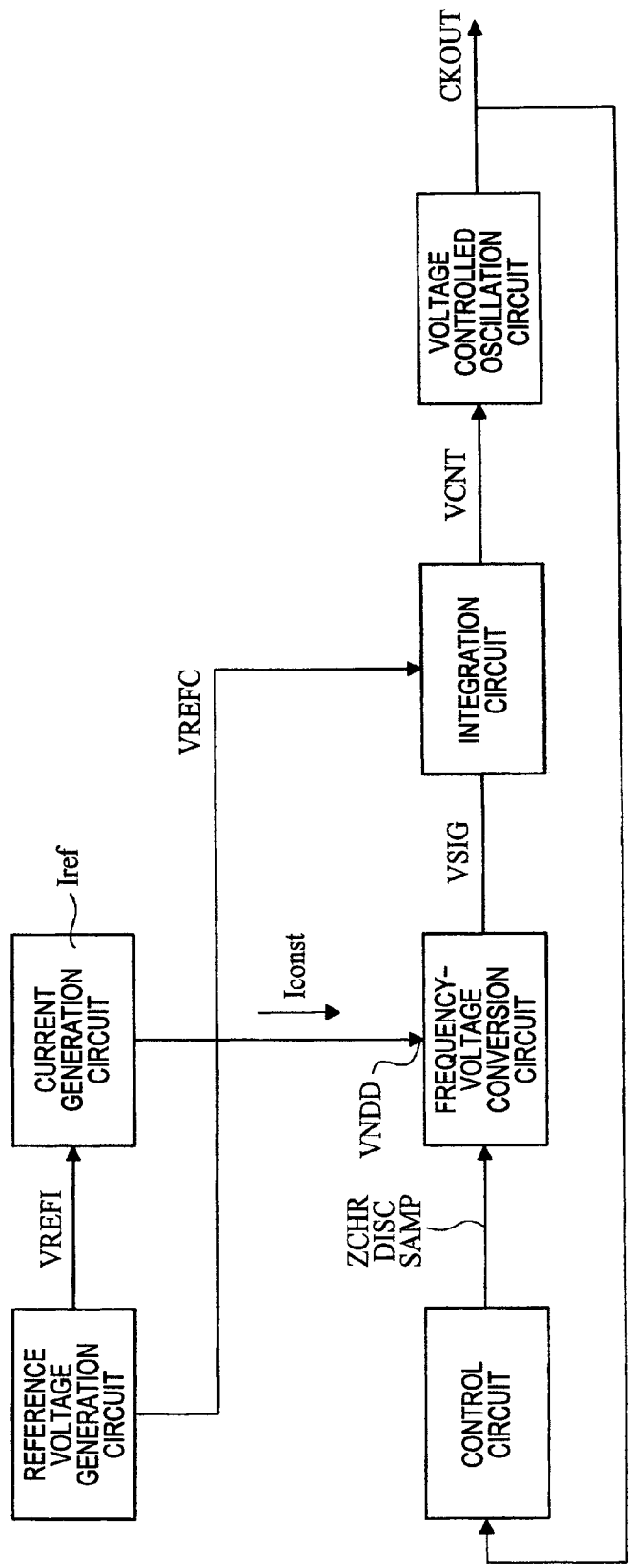
FIG. 44 is a block diagram illustrating a basic configuration of an oscillator.

In each of the embodiments described above, an example has been shown in which the clock oscillation circuit 2 includes the reference voltage generation circuit 10, the current output circuit 11, the control circuit 12, the frequency-voltage conversion circuit 13, the integration circuit 14, and the voltage controlled oscillation circuit 15. However, as shown in FIG. 43, it is also possible to, e.g., newly provide a frequency divider 16 between the control circuit 12 and the voltage controlled oscillation circuit 15.

By providing the frequency divider 16, the control of the clock oscillation circuit 2 is performed with respect to the divided frequency of the clock signal CKOUT. As a result, it is possible to provide the clock signal CKOUT with a higher frequency without increasing a frequency for a circuit operation.

The present invention is suited to a technology for generating a high-accuracy clock signal in a semiconductor device including an oscillation circuit which internally generates an operation clock.

What is claimed is:
1. A semiconductor device, comprising:
a power supply terminal to which an external power supply voltage is supplied;
a clock oscillation circuit which outputs a clock signal and connected to the power supply terminal; and
an internal circuit which operates in accordance with an operation frequency generated based on the clock signal, wherein the clock oscillation circuit includes:
a current output circuit configured to output an output current and adjust an amount of the output current in response to a plurality of first control signals stored in a nonvolatile memory; and
a frequency-voltage conversion circuit which has a plurality of electrostatic capacitive elements configured to be coupled in parallel to a capacitive node receiving the output current, and is configured to change the number of the electrostatic capacitive elements to be coupled in parallel to the capacitive node in response to a plurality of second control signals stored in the nonvolatile memory.

2. A semiconductor device according to claim 1, further comprising:
a clock setting portion which generates a clock setting signal for setting the number of the electrostatic capacitive elements to be coupled to the capacitive node.

3. A semiconductor device according to claim 2, further comprising:
an oscillation circuit which outputs the clock signal, the frequency of which is set based on an output voltage of the frequency-voltage conversion circuit.

4. A semiconductor device according to claim 3,
wherein the frequency-voltage conversion circuit includes:
a charge switch for injecting charges into the electrostatic capacitive elements with the output current from the current output circuit; and
a discharge switch for extracting the charges from the electrostatic capacitive elements.

5. A semiconductor device according to claim 4, further comprising:
a control circuit which controls the charge switch and the discharge switch in accordance with the clock signal.

6. A semiconductor device according to claim 1,
wherein the electrostatic capacitive elements include:
a first electrostatic capacitive element portion which is constantly coupled; and
a second electrostatic capacitive element portion which is selectively coupled to the capacitive node in accordance with the second control signals.

7. A semiconductor device according to claim 6, further comprising:
a third electrostatic capacitive element portion which is selectively coupled to the capacitive node in accordance with the second control signals,
wherein the third electrostatic capacitive element portion has a capacitance value different from that of the second electrostatic capacitive element portion.

8. A semiconductor device according to claim 6, further comprising:
a third electrostatic capacitive element portion which is selectively coupled to the capacitive node in accordance with the second control signals,
wherein the third electrostatic capacitive element portion is formed by coupling in parallel the electrostatic capacitive elements which are the same in capacitance value as and different in number from the electrostatic capacitive elements of the second electrostatic capacitive element portion.

9. A semiconductor device according to claim 6, further comprising:
a capacitor selection switch which selectively couples the second electrostatic capacitive element portion to the capacitive node in accordance with the capacitor selection signal,
wherein the output current is supplied to one coupling portion of the capacitor selection switch via the charge switch, and one coupling portion of the second electrostatic capacitive element portion is coupled to the other coupling portion of the capacitor selection switch,
wherein the charge switch and the discharge switch are each coupled to one coupling portion of the first electrostatic capacitive element portion, and a reference voltage is supplied to the other coupling portion of the first electrostatic capacitive element portion, and
wherein the reference voltage is supplied to the other coupling portion of the second electrostatic capacitive element portion.

10. A semiconductor device according to claim 6, further comprising:
a capacitor selection switch which selectively couples the second electrostatic capacitive element portion to the capacitive node in accordance with the second control signals,
wherein a reference voltage is supplied to one coupling portion of the capacitor selection switch, and one coupling portion of the second electrostatic capacitive element portion is coupled to the other coupling portion of the capacitor selection switch,
wherein the charge switch and the discharge switch are each coupled to the other coupling portion of the second electrostatic capacitive element portion, and
wherein the charge switch and the discharge switch are each coupled to one coupling portion of the first electrostatic capacitive element portion, and the reference voltage is supplied to the other coupling portion of the first electrostatic capacitive element portion.

11. A semiconductor device according to claim 10,
wherein the capacitor selection switch has a reset circuit which holds, during a period during which the discharge switch is in an ON state, based on a reset signal, the capacitor selection switch non-selected by the second control signals in the ON state for a given period.

12. A semiconductor device according to claim 10,
wherein the capacitor selection switch is formed of two transistors coupled in series.

13. A semiconductor device, comprising:
a clock oscillation circuit which outputs a clock signal; and
an internal circuit which operates in accordance with an operation frequency generated based on the clock signal outputted from the clock oscillation circuit,
wherein the clock oscillation circuit includes:
a constant current circuit for supplying a constant output current and to adjust the amount of the output current in response to a plurality of first control signals stored in a nonvolatile memory;
a capacitive node for receiving the output current from the constant current circuit;
a frequency-voltage conversion circuit having a plurality of electrostatic capacitive elements configured to be coupled in parallel to the capacitive node, and is configured to switch the number of the electrostatic capacitive elements to be coupled to the capacitive node in response to a plurality of second control signals stored in the nonvolatile memory; and
an oscillation circuit for setting a frequency of the clock signal based on an output voltage of the frequency-voltage conversion circuit, and outputting the clock signal.

14. A semiconductor device according to claim 13,
wherein the frequency-voltage conversion circuit has a charge switch coupled between an output node to which the output current from the constant current circuit is outputted and the capacitive node, and a discharge switch coupled between the capacitive node and a reference voltage node to which a reference voltage is supplied.

* * * * *